United States Patent
Wakatsuki et al.

(10) Patent No.: US 10,269,825 B2
(45) Date of Patent: Apr. 23, 2019

(54) SEMICONDUCTOR DEVICE AND METHOD FOR MANUFACTURING SAME

(71) Applicant: Toshiba Memory Corporation, Tokyo (JP)

(72) Inventors: Satoshi Wakatsuki, Mie (JP); Atsuko Sakata, Mie (JP); Daisuke Ikeno, Mie (JP)

(73) Assignee: Toshiba Memory Corporation, Tokyo (JP)

(*) Notice: Subject to any disclaimer, the term of this patent is extended or adjusted under 35 U.S.C. 154(b) by 71 days.

(21) Appl. No.: 15/258,275

(22) Filed: Sep. 7, 2016

(65) Prior Publication Data

US 2017/0263621 A1 Sep. 14, 2017

Related U.S. Application Data

(60) Provisional application No. 62/307,855, filed on Mar. 14, 2016.

(51) Int. Cl.
*H01L 27/1157* (2017.01)
*H01L 27/11582* (2017.01)

(52) U.S. Cl.
CPC .... *H01L 27/11582* (2013.01); *H01L 27/1157* (2013.01)

(58) Field of Classification Search
CPC ........ H01L 27/11507; H01L 27/11509; H01L 27/11514; H01L 27/11556; H01L 27/11563
See application file for complete search history.

(56) References Cited

U.S. PATENT DOCUMENTS

| | | | |
|---|---|---|---|
| 2011/0303971 A1 | 12/2011 | Lee et al. | |
| 2012/0083077 A1* | 4/2012 | Yang | H01L 27/11582 438/156 |
| 2012/0104352 A1* | 5/2012 | Aoyama | B82Y 10/00 257/5 |
| 2016/0172368 A1* | 6/2016 | Pang | H01L 27/11556 257/314 |
| 2017/0047334 A1* | 2/2017 | Lu | H01L 27/11519 |

* cited by examiner

*Primary Examiner* — Marc Anthony Armand
(74) *Attorney, Agent, or Firm* — Finnegan, Henderson, Farabow, Garrett & Dunner, L.L.P.

(57) ABSTRACT

According to one embodiment, a stacked body includes a plurality of metal layers stacked with an insulator interposed. A semiconductor body extends in a stacking direction through the stacked body. A charge storage portion is provided between the semiconductor body and one of the metal layers. A metal nitride film has a first portion and a second portion. The first portion is provided between the charge storage portion and one of the metal layers. The second portion is thicker than the first portion and is provided between one of the metal layers and the insulator.

13 Claims, 23 Drawing Sheets

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/307,855, filed on Mar. 14, 2016; the entire contents of which are incorporated herein by reference.

FIELD

Embodiments described herein relate generally to a semiconductor device and a method for manufacturing a semiconductor device.

BACKGROUND

In a method for manufacturing a three-dimensional memory device, a method has been proposed in which a columnar portion including a charge storage portion and a semiconductor body is formed in a stacked body in which insulating layers and sacrificial layers are stacked alternately, and the sacrificial layers are subsequently replaced with metal layers. In such a replacement process, a method also has been proposed in which the metal layers are formed, with a metal nitride film interposed, inside the gaps between the insulating layers formed by the removal of the sacrificial layers.

DETAILED DESCRIPTION

Figure 1:
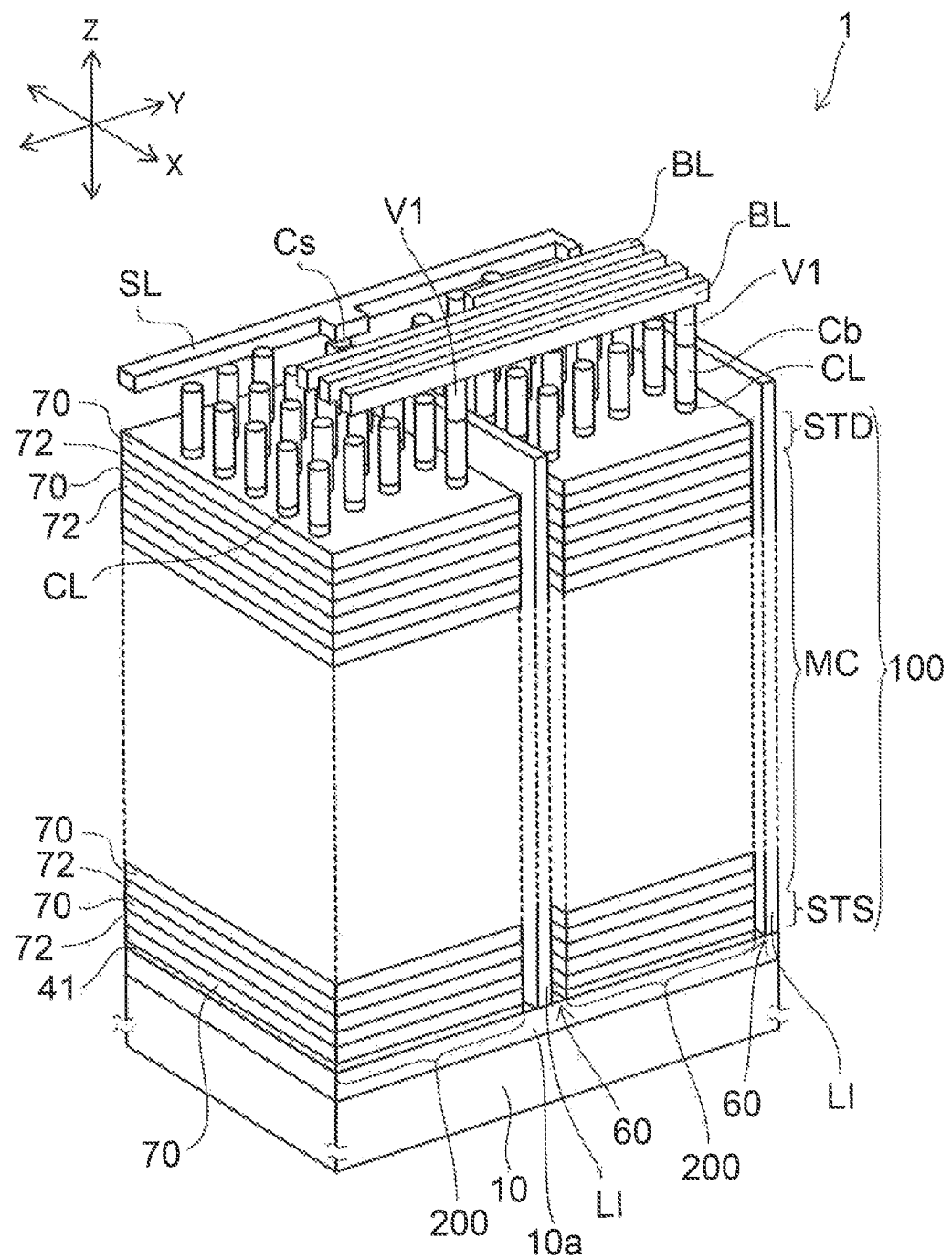
FIG. 1 is a schematic perspective view of a semiconductor device of an embodiment.

According to one embodiment, a semiconductor device includes a foundation layer, a stacked body, a semiconductor body, a charge storage portion, and a metal nitride film. The stacked body is provided above the foundation layer. The stacked body includes a plurality of metal layers stacked with an insulator interposed. The semiconductor body extends in a stacking direction through the stacked body. The charge storage portion is provided between the semiconductor body and one of the metal layers. The metal nitride film has a first portion and a second portion. The first portion is provided between the charge storage portion and one of the metal layers. The second portion is thicker than the first portion and is provided between one of the metal layers and the insulator.

Embodiments will now be described with reference to the drawings. The same components in the drawings are marked with the same reference numerals.

In the embodiments, for example, the semiconductor memory device including a memory cell array having a three-dimensional structure is described as a semiconductor device.

FIG. 1 is a schematic perspective view he memory cell array 1 of the embodiment.

Figure 2:
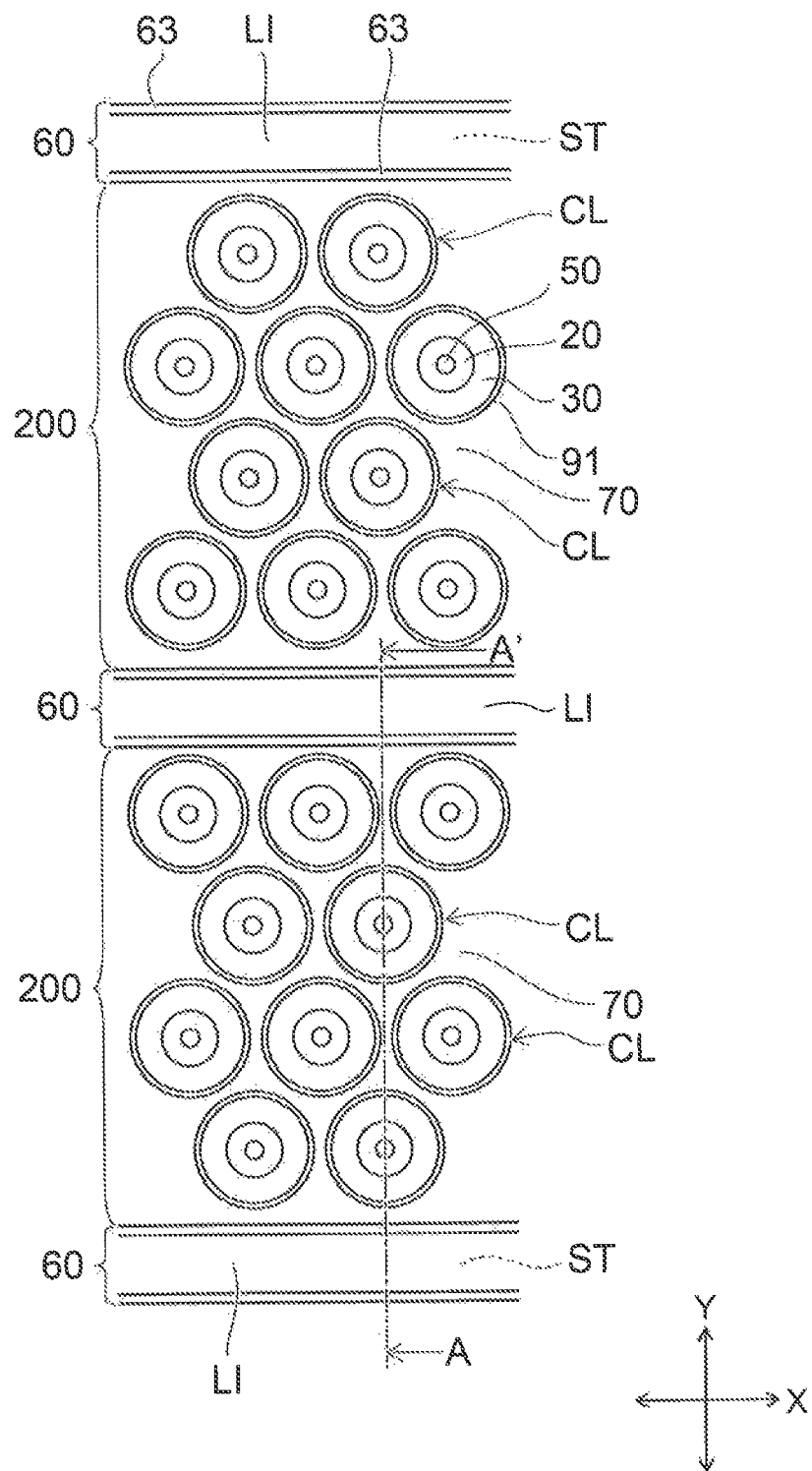
FIG. 2 is a schematic plan view of the semiconductor device of the embodiment.

FIG. 2 is a schematic plan view of multiple columnar portions CL and multiple separation portions 60 of the memory cell array 1.

Figure 3:
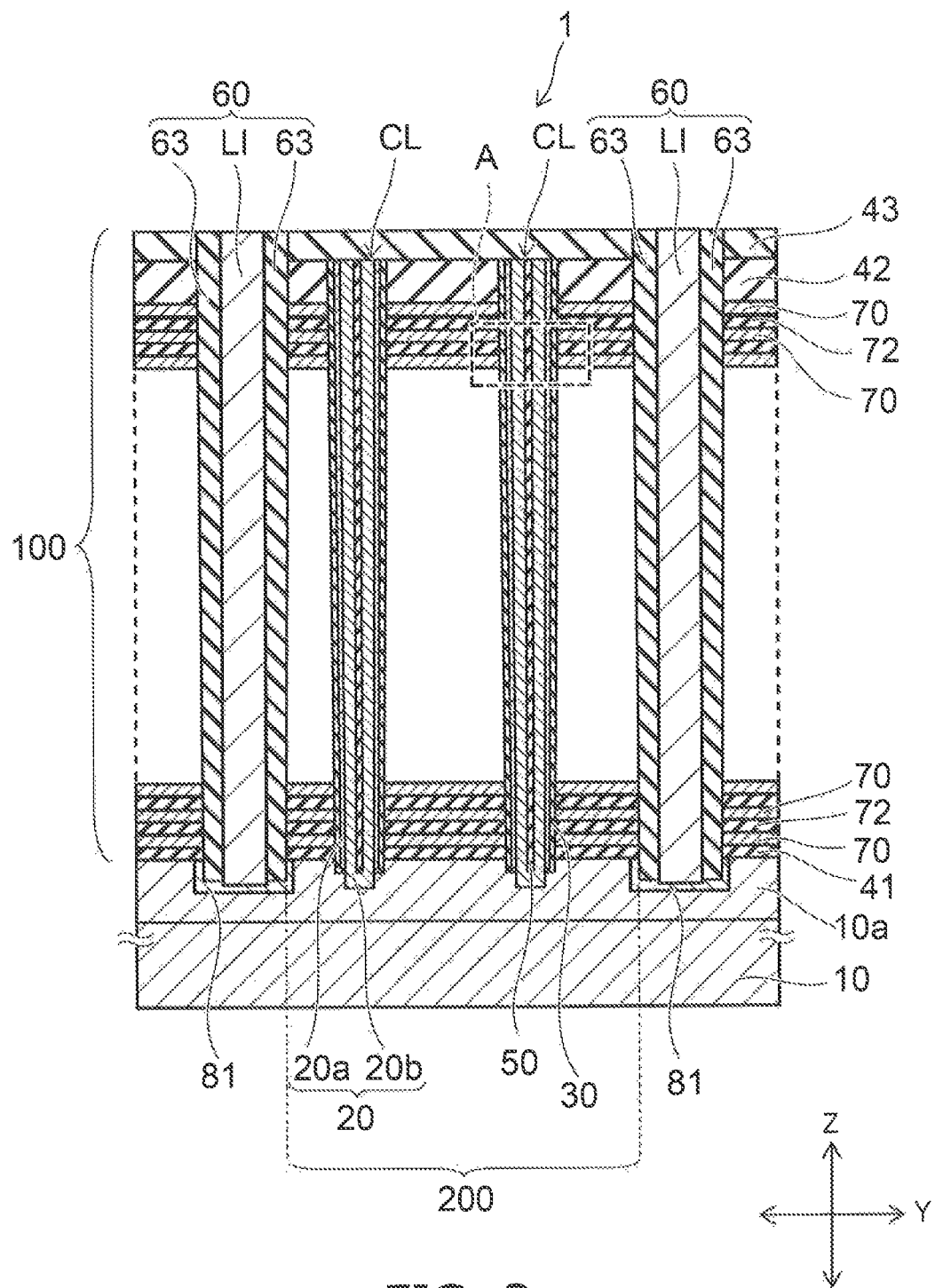
FIG. 3 is a schematic cross-sectional view of the semiconductor device of the embodiment.

FIG. 3 is an A-A' cross-sectional view of FIG. 2.

Figure 4A:
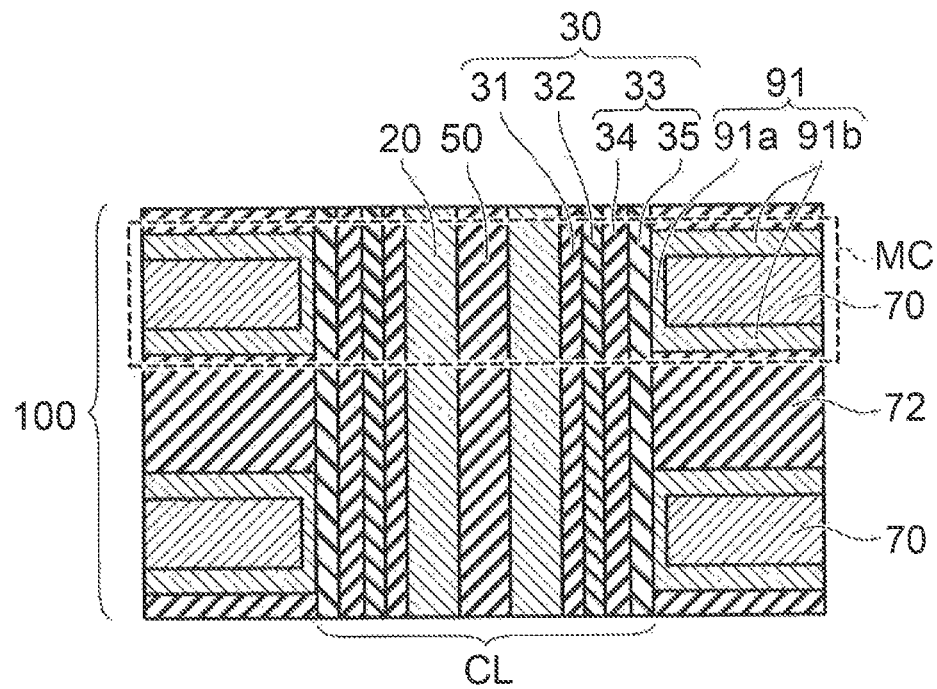
FIGS. 4A and 4B are enlarged cross-sectional views of portion A of FIG. 3.

FIG. 4A is an enlarged cross-sectional view of portion A of FIG. 3.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 stacked on the substrate 10, the multiple columnar portions CL, the multiple separation portions 60, and upper layer interconnects provided above the stacked body 100. In FIG. 1, for example, bit lines BL and a source line SL are shown as the upper layer interconnects.

The columnar portions CL are formed in circular columnar or elliptical columnar configurations extending through the stacked body 100 in the stacking direction of the stacked body 100 (the Z-direction). The separation portions 60 spread in the X-direction and the stacking direction of the stacked body 100 (the Z-direction), and divide the stacked body 100 into multiple blocks (or finger portions) 200 in the Y-direction.

For example, the multiple columnar portions CL have a staggered arrangement. Or, the multiple columnar portions CL may have a square lattice arrangement along the X-direction and the Y-direction.

The bit lines BL are provided above the stacked body 100 as shown in FIG. 1. The bit lines BL are, for example, metal films extending in the Y-direction. The bit lines BL are separated from each other in the X-direction.

The upper ends of semiconductor bodies 20 of the columnar portions CL described below are connected to the bit lines BL via contacts Cb and contacts V1 shown in FIG. 1.

The multiple columnar portions CL are connected to one common bit line BL. The multiple columnar portions CL that are connected to the common bit line BL include one columnar portion CL selected from each block (or finger portion) 200 divided in the Y-direction by the separation portions 60.

As shown in FIG. 3, the stacked body 100 includes multiple metal layers 70 stacked on the substrate 10. The multiple metal layers 70 are stacked, with insulating layers 72 interposed as an insulator, in a direction (the Z-direction) perpendicular to the major surface of the substrate 10.

The metal layer 70 is, for example, a tungsten layer including tungsten as a major component, or a molybdenum layer including molybdenum as a major component. The insulating layer 72 is, for example, a silicon oxide layer including $SiO_2$ as a major component, The substrate 10 is, for example, a silicon substrate; and, for example, a P-type well 10a which is a P-type silicon region is provided as a semiconductive foundation layer on the front surface side of the substrate 10.

An insulating film 41 is provided on the front surface of the P-type well 10a. The lowermost metal layer 70 is provided on the insulating film 41. An insulating film 42 is provided on the uppermost metal layer 70; and an insulating film 43 is provided on the insulating film 42. The insulating film 43 covers the upper ends of the columnar portions CL.

As shown in FIG. 4A, the columnar portion CL includes a memory film 30, the semiconductor body 20, and an insulative core film 50. The semiconductor body 20, the memory film 30, and the core film 50 extend to be continuous along the stacking direction of the stacked body 100.

The semiconductor body 20 is formed in a pipe-like configuration; and the core film 50 is provided on the inner side of the semiconductor body 20. The memory film 30 is provided between the semiconductor body 20 and the metal layers 70, and surrounds the periphery of the semiconductor body 20. The upper ends of the semiconductor bodies 20 are connected to the bit lines BL via the contacts Cb and the contacts V1 shown in FIG. 1. The lower ends of the semiconductor bodies 20 contact the P-type well 10a of the substrate 10 as shown in FIG. 3.

The memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided in order from the metal layer 70 side between the semiconductor body 20 and the metal layers 70.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the metal layers 70.

A metal nitride film 91 is provided between the memory film 30 and the metal layers 70. The metal nitride film 91 is also provided between the metal layers 70 and the insulating layers 72. The metal nitride film 91 is formed to be continuous along the upper surface of the metal layer 70, the lower surface of the metal layer 70, and the side surface of the metal layer 70 on the columnar portion CL side.

The metal nitride film 91 is divided in the stacking direction of the stacked body 100, and is not continued in the stacking direction. The metal layers 70 are not shorted via the metal nitride film 91. The metal layer 70 surrounds the columnar portion CL from the outer circumferential side with the metal nitride film 91 interposed.

The semiconductor body 20, the memory film 30, and the metal layer 70 are included in a memory cell MC. One memory cell MC is illustrated by the broken line in FIG. 4A. The memory cell MC has a vertical transistor structure in which the metal layer 70 surrounds, with the memory film 30 interposed, the periphery of the semiconductor body 20.

The metal layers 70 oppose the semiconductor body 20 with the charge storage film 32 interposed, and function as control gates of the memory cells MC. The semiconductor body 20 is, for example, a channel body of silicon. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the metal layer 70. Also, the blocking insulating film 33 prevents back-tunneling of the charge from the metal layer 70 into the columnar portion CL.

The blocking insulating film 33 includes a silicon oxide film 34 as a first blocking film, and a metal oxide film 35 as a second blocking film. The metal oxide film 35 has a dielectric constant higher than that of the silicon oxide film 34, and includes at least one of zirconium (Zr) or hafnium (Hf). The metal oxide film 35 is a zirconium oxide film including zirconium oxide as a major component, or a hafnium oxide film including hafnium oxide as a major component.

The silicon oxide film 34 is provided between the charge storage film 32 and the metal oxide film 35. The metal oxide film 35 is provided between the silicon oxide film 34 and the metal nitride film 91.

The metal nitride film 91 has a first portion 91a and a second portion 91b. The first portion 91a and the second portion 91b are provided as one body using the same material.

The metal nitride film 91 includes at least one of titanium nitride, titanium silicide nitride, tantalum nitride, tantalum silicide nitride, tungsten nitride, tungsten silicide nitride, molybdenum nitride, or molybdenum silicide nitride.

The first portion 91a is provided between the metal oxide film 35 and the side surface of the metal layer 70. The second portion 91b is provided between the insulating layer 72 and the upper surface of the metal layer 70, and between the insulating layer 72 and the lower surface of the metal layer 70.

The first portion 91a contacts the metal oxide film 35 and the metal layer 70. The second portion 91b contacts the metal layer 70 and the insulating layer 72.

The film thickness of the first portion 91a is thinner than the film thickness of the second portion 91b. The film thickness of the metal layer 70 is thicker than two times the film thickness of the second portion 91b of the metal nitride film 91.

The metal layer 70 is, for example, a tungsten layer or a molybdenum layer formed by chemical vapor deposition (CVD). There are cases where the metal layer 70 includes, for example, fluorine due to the gas used in the CVD. The diffusion of the fluorine into the insulating layer 72 or the columnar portion CL may cause the characteristics of the insulating layer 72 or the columnar portion CL to degrade.

The metal nitride film 91 prevents, for example, the diffusion of the fluorine included in the metal layer 70. Also, the metal nitride film 91 functions as a seed layer when forming the metal layer 70 by CVD.

As shown in FIG. 1, the upper layer portion of the stacked body 100 includes a drain-side selection transistor STD. At least the uppermost metal layer 70 functions as a control gate of the drain-side selection transistor STD.

The lower layer portion of the stacked body 100 includes a source-side selection transistor STS. At least the lowermost metal layer 70 functions as a control gate of the source-side selection transistor STS.

The memory cells MC are provided between the drain-side selection transistor STD and the source-side selection transistor STS. The memory cells MC, the drain-side selection transistor STD, and the source-side selection transistor STS are connected in series via the semiconductor body 20 of the columnar portion CL, and are included in one memory string. For example, the memory strings have a staggered arrangement in a planar direction parallel to the XY plane; and the memory cells MC are provided three-dimensionally in the X-direction, the Y-direction, and the Z-direction.

The separation portion 60 will now be described.

As shown in FIG. 2 and FIG. 3, the separation portion 60 includes an interconnect portion LI and an insulating film 63. The insulating film 63 is not shown in FIG. 1.

The interconnect portion LI spreads in the X-direction and the Z-direction. The interconnect portion LI is, for example, a film including a metal. The insulating film 63 is provided at the side surface of the interconnect portion LI. The insulating film 63 is provided between the stacked body 100 and the interconnect portion LI.

As shown in FIG. 3, multiple semiconductor regions 81 are formed in the front surface of the P-type well 10a. The lower ends of the interconnect portions LI contact the semiconductor regions 81. The multiple semiconductor regions 81 are provided to correspond to the multiple interconnect portions LI. The semiconductor regions 81 include an N-type semiconductor region 81 and a P-type semiconductor region 81.

The interconnect portions LI include an interconnect portion LI that is connected to the N-type semiconductor region 81, and an interconnect portion LI that is connected to the P-type semiconductor region 81.

The upper end of the interconnect portion LI connected to the N-type semiconductor region 81 is connected to the source line SL via a contact Cs shown in FIG. 1.

By controlling the potential applied to the lowermost metal layer 70, an N-channel (an inversion layer) can be induced in the front surface of the P-type well 10a between the N-type semiconductor region 81 and the lower end of the semiconductor body 20; and a current can be caused to flow between the N-type semiconductor region 81 and the lower end of the semiconductor body 20.

In a read operation, electrons are supplied from the interconnect portion LI to the semiconductor body 20 via the N-type semiconductor region 81 and the N-channel.

The upper end of the interconnect portion LI connected to the P-type semiconductor region 81 is connected to a not-shown upper layer interconnect. The P-type semiconductor region 81 supplies holes to the semiconductor body 20 via the P-type well 10a in an erasing operation.

A method for manufacturing the semiconductor device of the embodiment will now be described with reference to FIG. 5 to FIG. 18B. FIG. 5 to FIG. 15 correspond to the cross section of FIG. 3. FIG. 16A to FIG. 18B correspond to the cross section on the left side of the central axis of the columnar portion CL of FIG. 4A.

Figure 5:
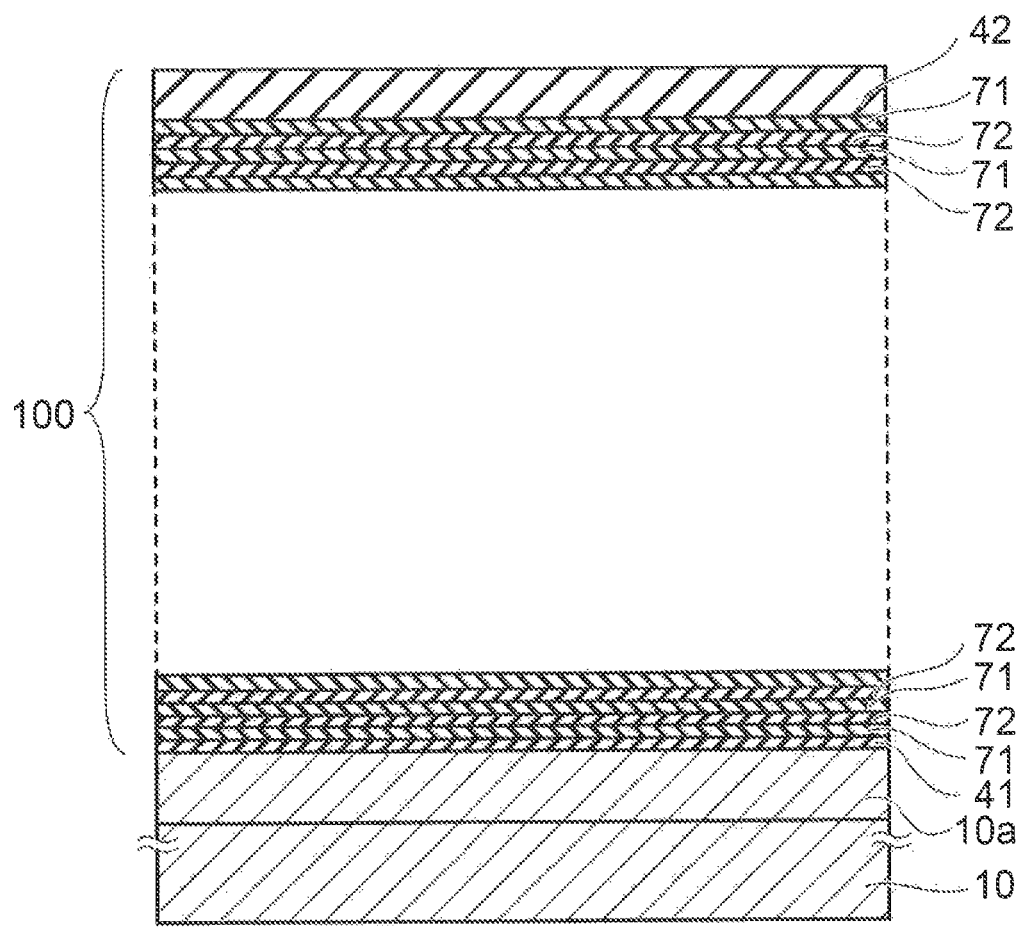
FIGS. 5 to 21 are schematic cross-sectional views showing a method for manufacturing the semiconductor device of the embodiment.

As shown in FIG. 5, the stacked body 100 is formed on the P-type well 10a of the substrate 10. The substrate 10 is a silicon substrate having silicon as a major component. The insulating film 41 is formed on the P-type well 10a. A process of alternately stacking a sacrificial layer 71 as a first layer, and the insulating layer 72 as a second layer on the insulating film 41 is repeated. For example, the sacrificial layer 71 is a silicon nitride layer; and the insulating layer 72 is a silicon oxide layer, For example, the sacrificial layer 71 and the insulating layer 72 are formed by CVD. The insulating layer 72 is formed using, for example, Tetra Ethyl Ortho Silicate (TEOS) and includes $SiO_2$ as a major component.

The lowermost sacrificial layer 71 is formed on the insulating film 41; and the lowermost insulating layer 72 is formed on the lowermost sacrificial layer 71. The insulating film 42 is formed on the uppermost sacrificial layer 71.

Figure 6:
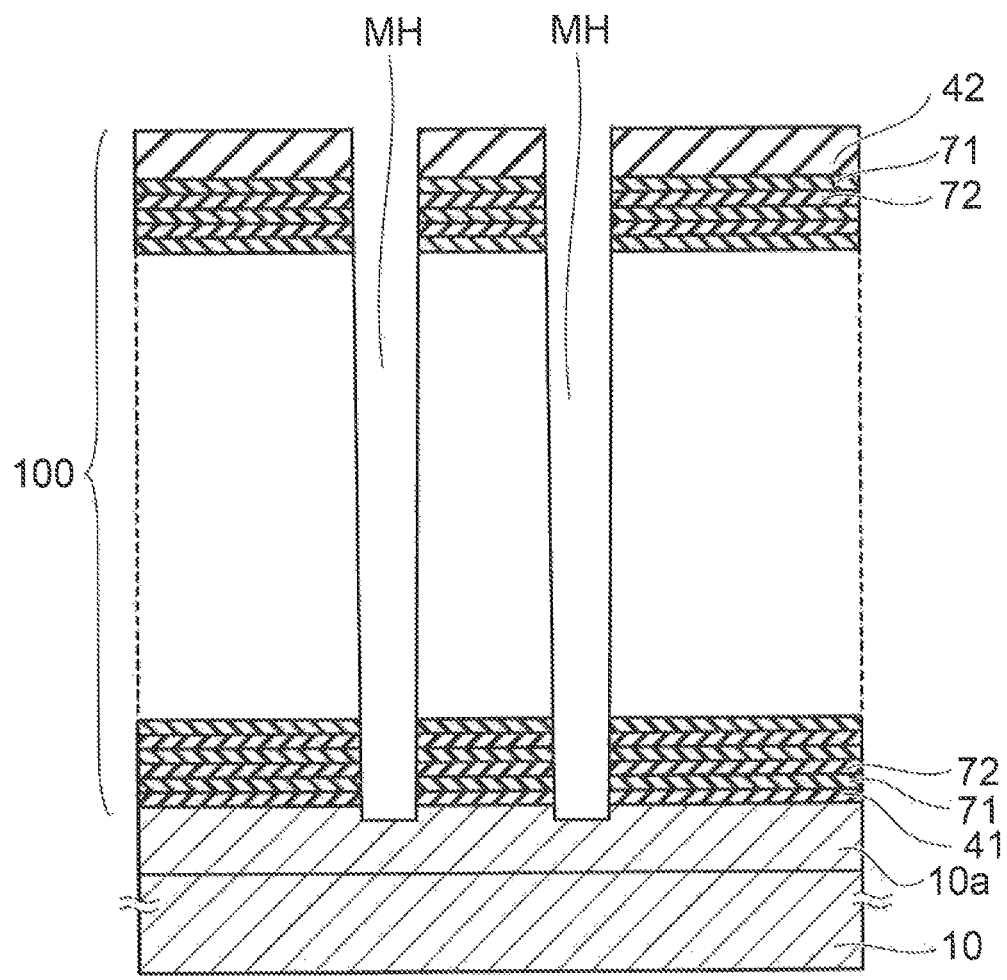

Then, as shown in FIG. 6, multiple memory holes MH are formed in the stacked body 100. The memory holes MH are formed by reactive ion etching (RIE) using a not-shown mask layer formed on the stacked body 100. The memory holes MH pierce the stacked body 100 and reach the P-type well 10a of the substrate 10.

Figure 7:
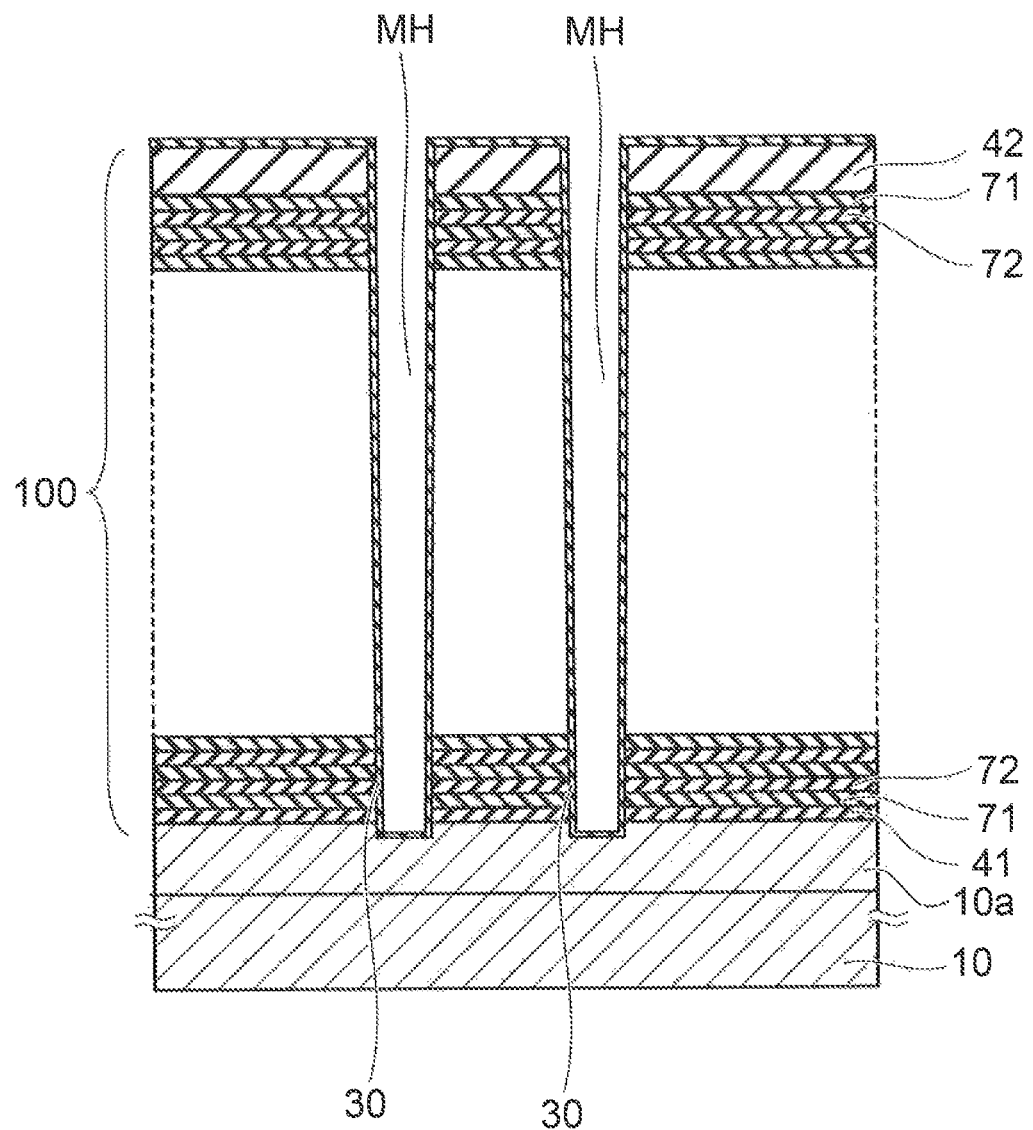

As shown in FIG. 7, the memory film 30 is formed inside the memory holes MH. The memory film 30 is formed conformally along the side surfaces and bottoms of the memory holes MH.

First, the metal oxide film (the second blocking film) 35 shown in FIG. 4A is formed on the side surfaces and bottoms of the memory holes MH. The silicon oxide film (the first blocking film) 34 is formed on the inner side of the metal oxide film 35. The charge storage film 32 is formed on the inner side of the silicon oxide film 34. The tunneling insulating film 31 is formed on the inner side of the charge storage film 32.

Figure 8:
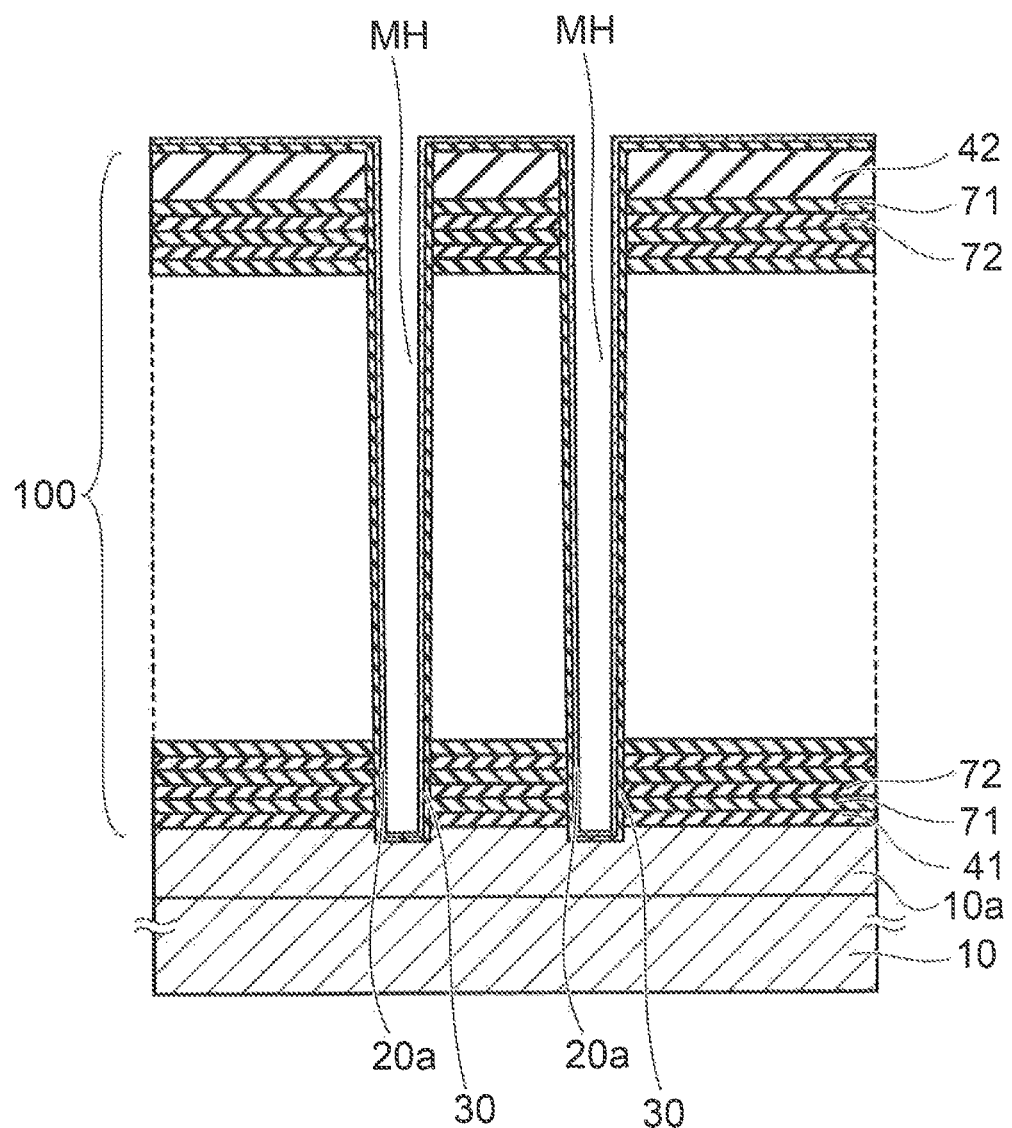

As shown in FIG. 8, a cover silicon 20a is formed on the inner side of the memory film 30. The cover silicon 20a is formed conformally along the side surfaces and bottoms of the memory holes MH.

Figure 9:
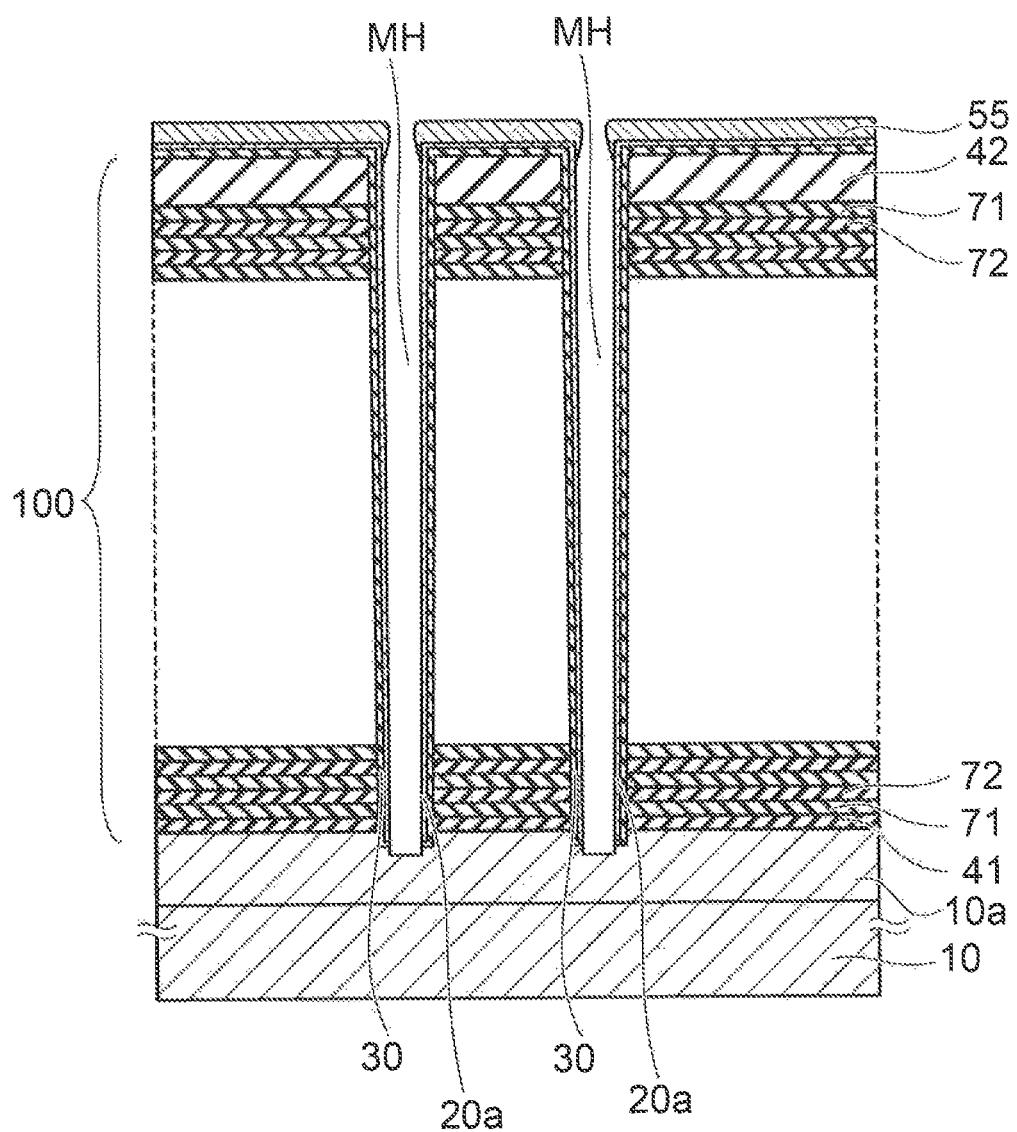

Then, as shown in FIG. 9, a mask layer 55 is formed on the stacked body 100; and the cover silicon 20a and the memory film 30 that are deposited on the bottoms of the memory holes MH are removed by RIE. In the RIE, the memory film 30 formed on the side surfaces of the memory holes MH is covered with and protected by the cover silicon 20a and is not damaged by the RIE.

Figure 10:
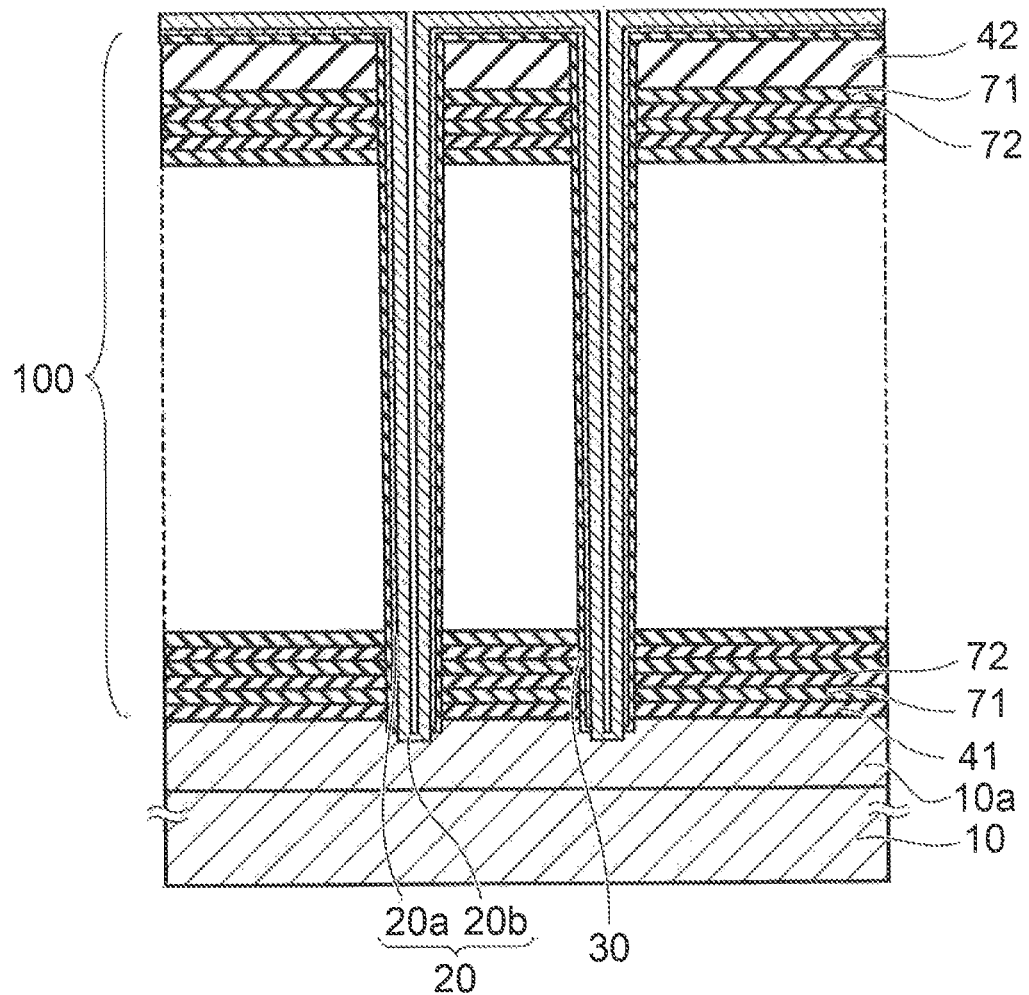

After removing the mask layer 55, a silicon body 20b is formed inside the memory holes MH as shown in FIG. 10. The silicon body 20b is formed on the side surface of the cover silicon 20a and the bottoms of the memory holes MH. The lower end portion of the silicon body 20b contacts the P-type well 10a of the substrate 10 at the bottoms of the memory holes MH.

For example, the cover silicon 20a and the silicon body 20b are formed as amorphous silicon films and subsequently crystallized into polycrystalline silicon films by heat treatment to become the semiconductor body 20 described above.

Figure 11:
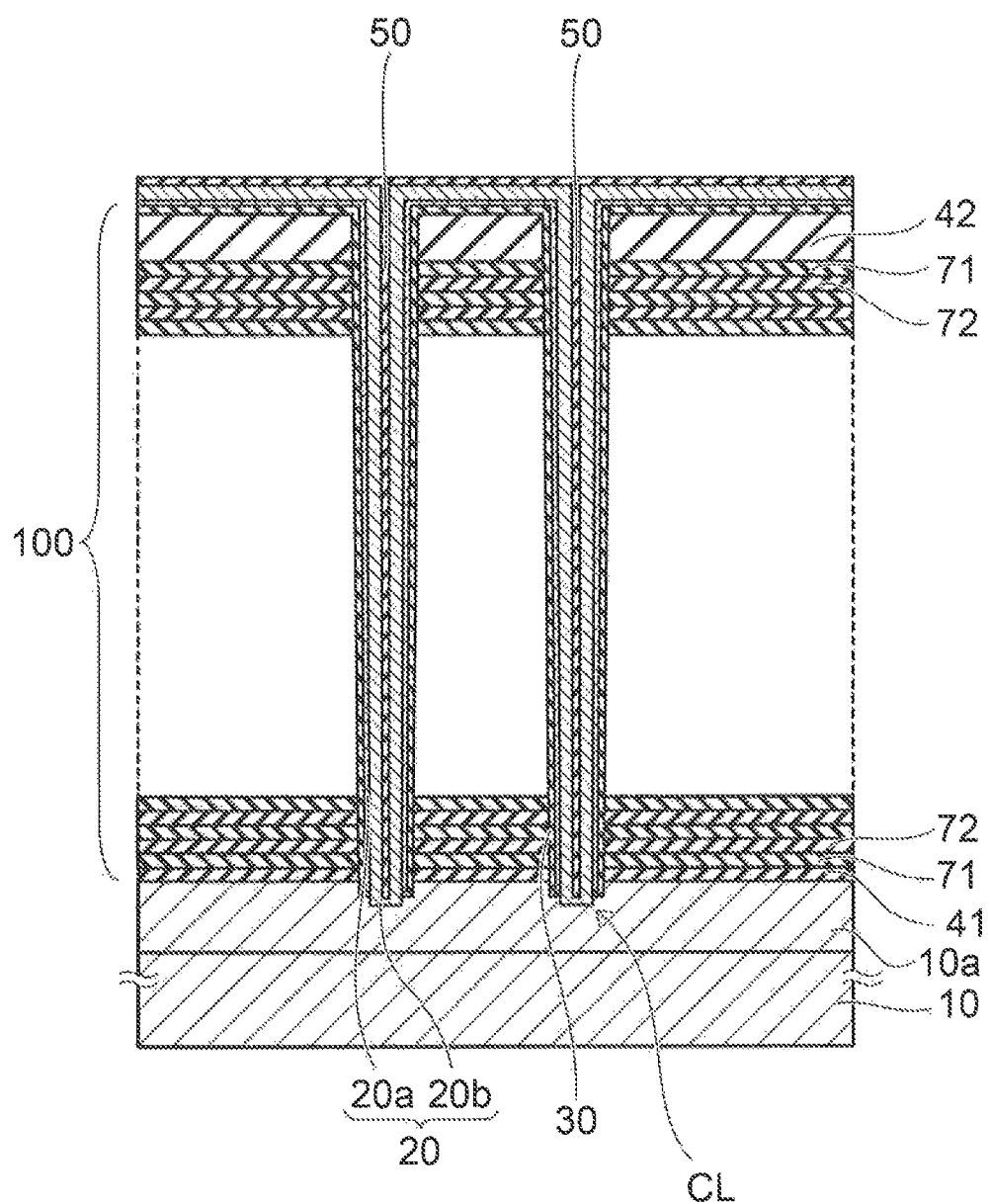

As shown in FIG. 11, the core film 50 is formed on the inner side of the silicon body 20b. Thus, the multiple columnar portions CL that include the memory film 30, the semiconductor body 20, and the core film 50 are formed inside the stacked body 100.

Figure 12:
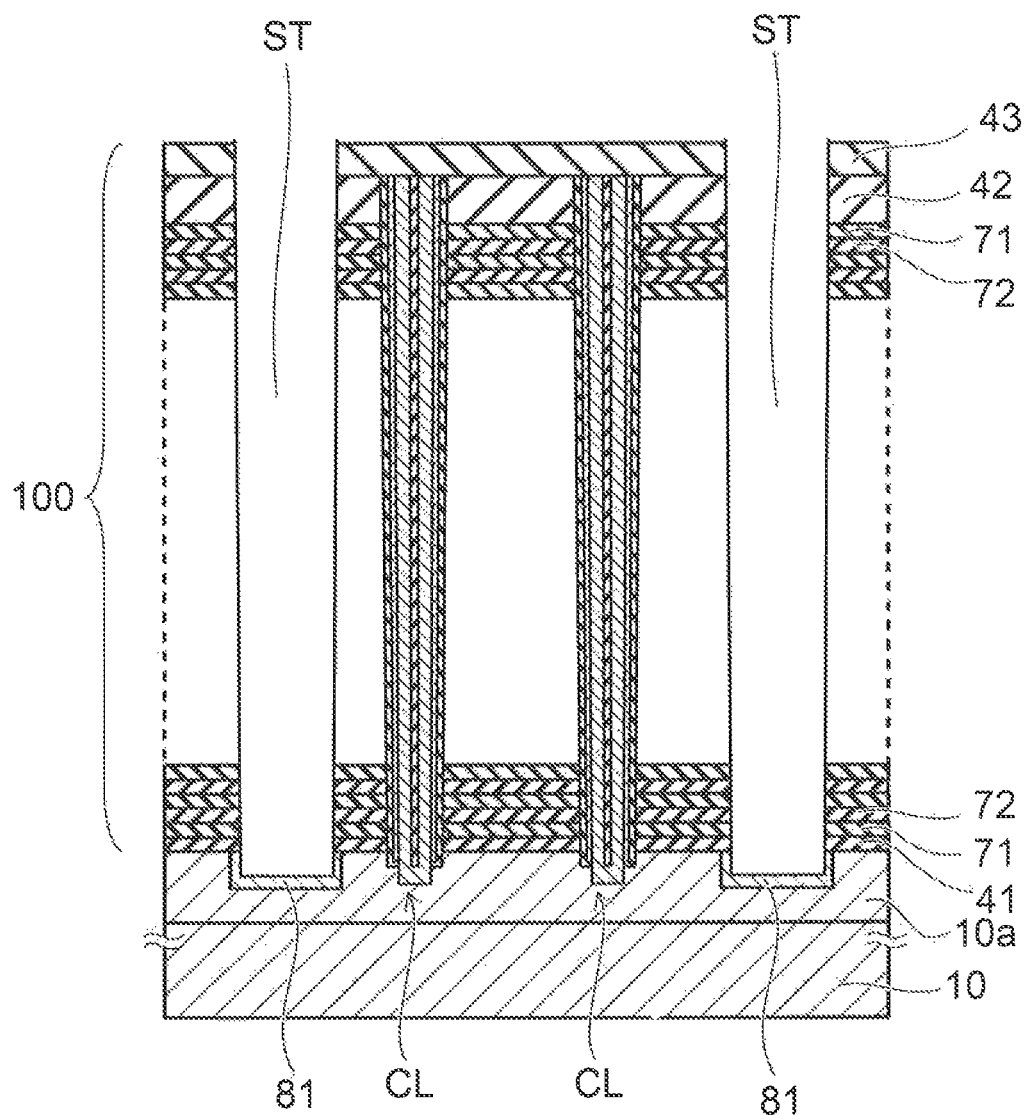

The films deposited on the insulating film 42 shown in FIG. 11 are removed by chemical mechanical polishing (CMP) or etch-back. Subsequently, the insulating film 43 is formed on the insulating film 42 as shown in FIG. 12. The insulating film 43 covers the upper ends of the columnar portions CL.

Figure 16A:
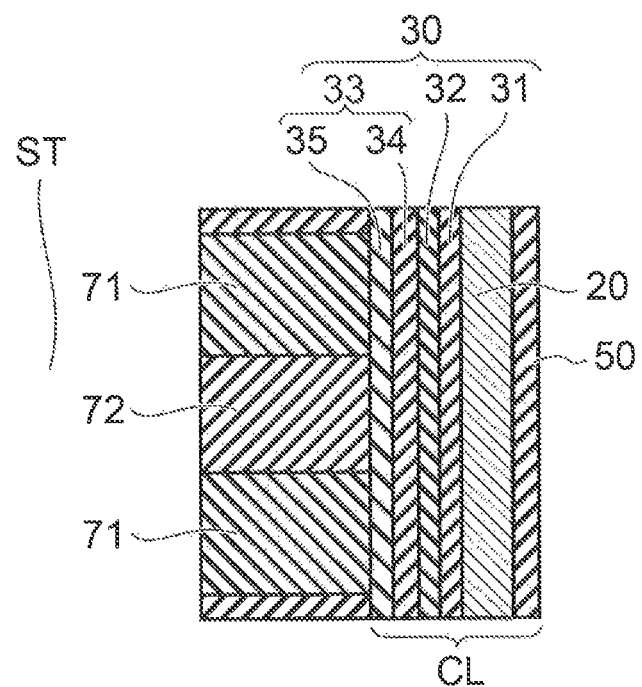

Then, multiple slits ST that extend in the stacking direction are formed in the stacked body 100 as shown in FIG. 12 and FIG. 16A by RIE using a not-shown mask. The slits ST pierce the stacked body 100 and reach the P-type well 10a. The slits ST extend in the X-direction shown in FIG. 1 and FIG. 2 and divide the stacked body 100 into the multiple blocks 200 in the Y-direction.

The N-type or P-type semiconductor region 81 is formed in the front surface of the P-type well 10a at the bottoms of the slits ST by implanting an impurity by ion implantation into the P-type well 10a exposed at the bottoms of the slits ST.

Then, the sacrificial layers 71 are removed by etching through the slits ST. The sacrificial layers 71 which are silicon nitride layers can be removed using, for example, an etchant including phosphoric acid.

Figure 13:
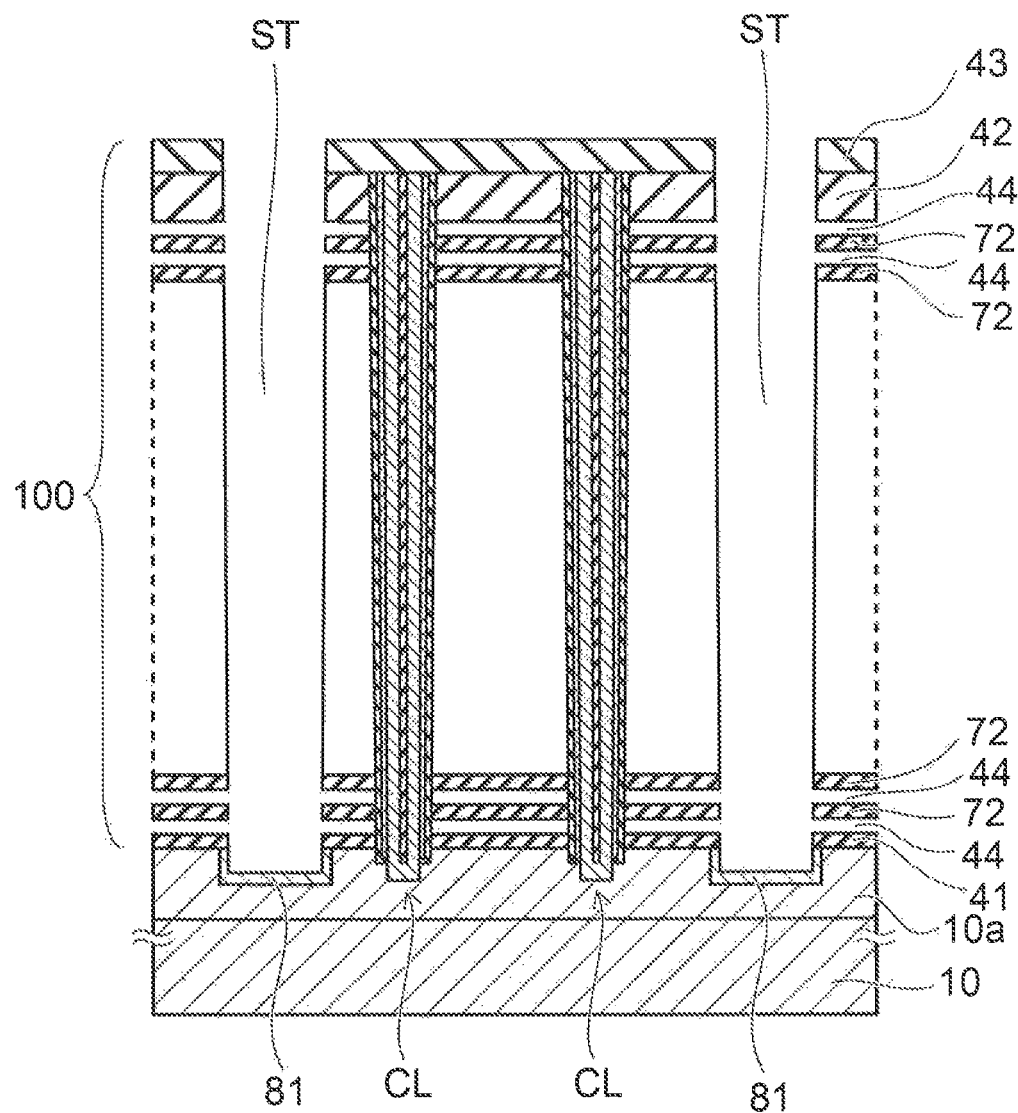
Figure 16B:
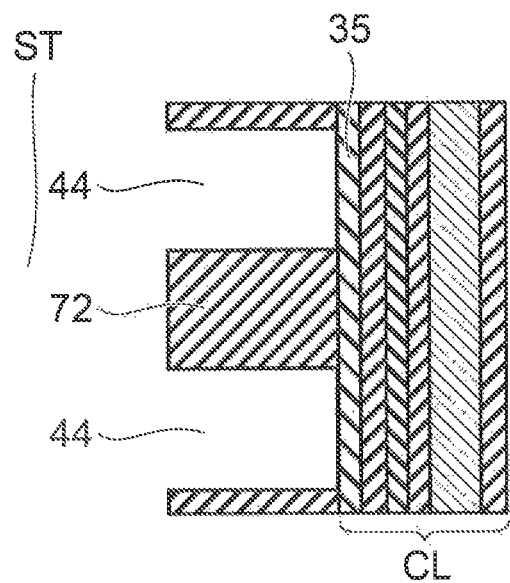

The sacrificial layers 71 are removed; and as shown in FIG. 13 and FIG. 16B, a gap 44 is formed between the insulating layers 72 adjacent to each other above and below. As shown in FIG. 13, the gap 44 is formed also between the insulating film 41 and the lowermost insulating layer 72, and between the insulating film 42 and the uppermost insulating layer 72.

The insulating layers 72 contact the side surfaces of the columnar portions CL to surround the side surfaces of the columnar portions CL. The insulating layers 72 are supported by such a physical bond with the columnar portions CL; and the gaps 44 are maintained between the insulating layers 72.

As shown in FIG. 16B, the gaps 44 expose the upper surface of the insulating layer 72, the lower surface of the insulating layer 72, and the side surface of the metal oxide film 35.

Figure 17A:
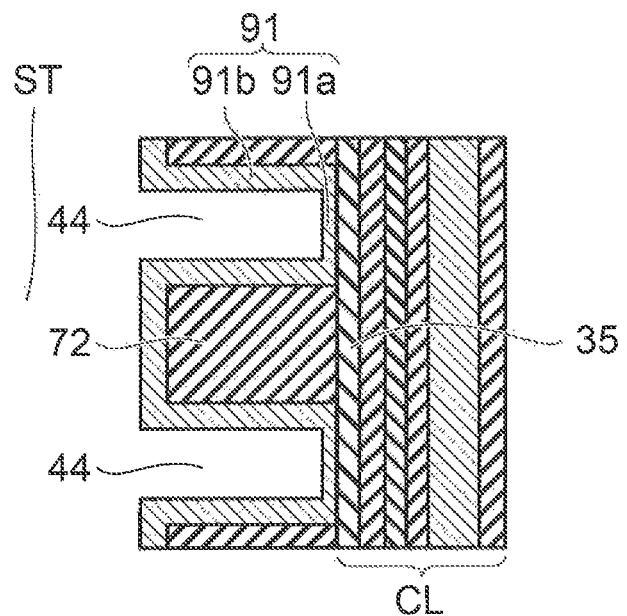

As shown in FIG. 17A, the metal nitride film 91 is formed inside the gaps 44. The metal nitride film 91 is formed on the upper surface of the insulating layer 72, the lower surface of the insulating layer 72, and the side surface of the metal oxide film 35. The metal nitride film 91 is further formed on the side surfaces of the insulating layers 72 exposed in the slit ST. The metal nitride film 91 is conformally formed to be continuous along the side surface, upper surface, and lower surface of the insulating layer 72, and the side surface of the metal oxide film 35. The gaps 44 remain on the inner side of the metal nitride film 91.

For example, a titanium nitride film is formed as the metal nitride film 91. For example, the titanium nitride film is formed by CVD using titanium chloride ($TiCl_4$) gas as a source gas of titanium and ($NH_3$) gas as a reducing gas. These gases are supplied to the gaps 44 through the slit ST.

In the CVD, a difference occurs between the film thickness of the first portion 91a and the film thickness of the second portion 91b of the metal nitride film 91 due to differences of the incubation time of titanium nitride. Here, the incubation time is the time when the growth of the titanium nitride starts.

Figure 22:
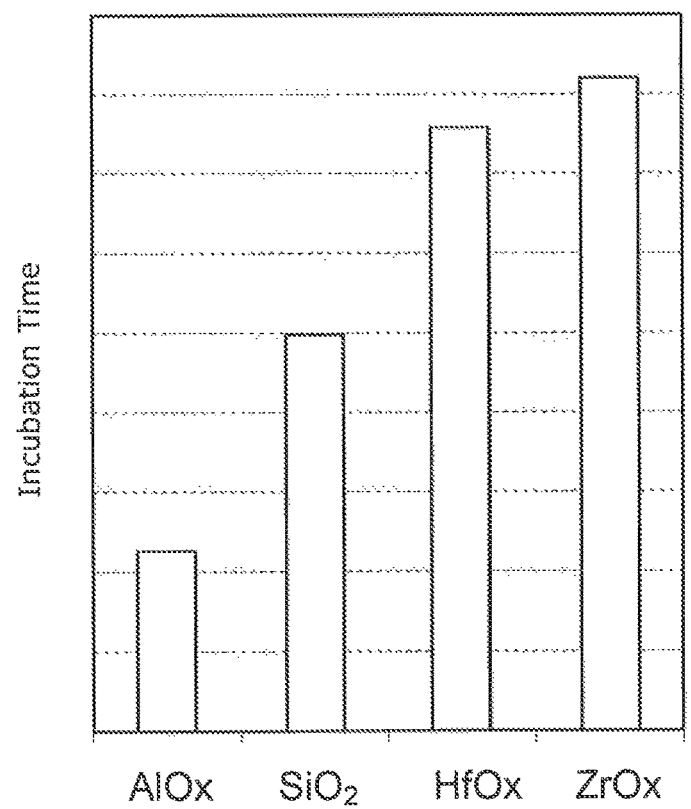
FIG. 22 is a comparison chart of an incubation time of titanium nitride on $AlO_x$, $SiO_2$, $HfO_x$, and $ZrO_x$.

FIG. 22 is a comparison chart of the incubation time of titanium nitride on aluminum oxide ($AlO_x$), silicon oxide ($SiO_2$), hafnium oxide ($HfO_x$), and zirconium oxide ($ZrO_x$).

FIG. 22 shows relative incubation times having, as a reference, the incubation time of titanium nitride on silicon oxide ($SiO_2$).

From FIG. 22, the time when the growth of titanium nitride starts on hafnium oxide ($HfO_x$) and the time when the growth of titanium nitride starts on zirconium oxide ($ZrO_x$) are slower than the time when the growth of titanium nitride starts on silicon oxide ($SiO_2$).

Accordingly, the metal nitride film 91 starts to grow with a film thickness difference between the portion formed on the metal oxide film 35 which is the zirconium oxide film or the hafnium oxide film, and the portion formed on the insulating layer 72 which is the silicon oxide layer. The CVD of the metal nitride film 91 is stopped while the film thickness difference is still occurring.

Accordingly, the film thickness of the first portion 91a formed on the side surface of the metal oxide film 35 is thinner than the film thickness of the second portion 91b formed on the upper surface and lower surface of the insulating layer 72.

Figure 17B:
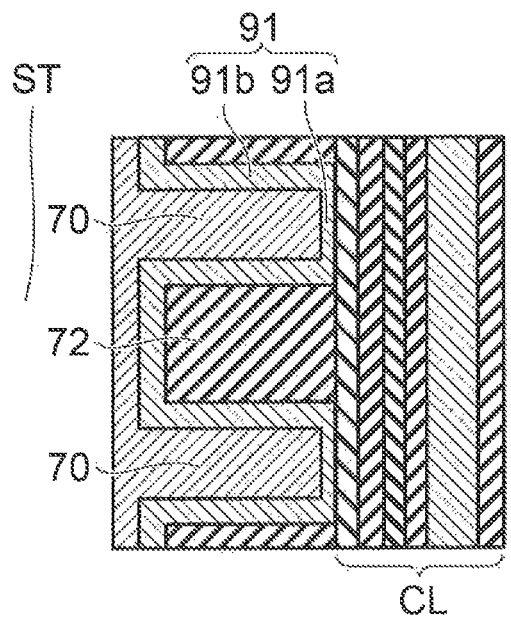

The metal layer 70 is formed as shown in FIG. 17B in the gaps 44 on the inner side of the metal nitride film 91. For example, a tungsten layer or a molybdenum layer is formed by CVD as the metal layer 70. The gas in the CVD is supplied to the gaps 44 through the slit ST.

It is extremely difficult to form the tungsten layer or the molybdenum layer by CVD with good adhesion on the insulating layers 72 and the metal oxide film 35. Therefore, according to the embodiment, the metal layer (the tungsten layer or the molybdenum layer) 70 is formed inside the gaps 44 by utilizing, as a seed layer, the metal nitride film 91 which has a metal crystal structure.

The process of forming, for example, the tungsten layer as the metal layer 70 by CVD includes a process of forming a tungsten initial film having low crystallinity or a microcrystal tungsten initial film on the surface of the metal nitride film 91, and a process of forming a tungsten layer, which is thicker than the initial film and has a large grain size, on the inner side of the initial film.

For example, the initial film is formed by the reaction between tungsten fluoride ($WF_6$) gas which is a source gas of tungsten and diborane ($B_2H_6$) gas which is a reducing gas. After the formation of the initial film, a tungsten layer is formed on the inner side of the initial film by a reaction between the $WF_6$ gas and hydrogen ($H_2$) gas which is a reducing gas.

The molybdenum layer also can be formed by CVD using, for example, $MoF_6$ gas as a source gas and further by using a reducing gas similar to that of the CVD of the tungsten layer.

Because the initial film is formed on the surface of the metal nitride film 91 in the initial film formation of the metal layer (the tungsten layer or the molybdenum layer) 70, the crystallinity of the tungsten or the molybdenum formed on the inner side of the initial film and the crystallinity of the metal nitride film 91 can be separated. The crystallinity of the metal nitride film 91 does not affect the crystallinity of the metal layer 70. This promotes the larger grain size of the tungsten or the molybdenum due to the $H_2$ reduction reaction and reduces the resistance of the metal layer 70.

Fluorine is incorporated inside the metal layer (the tungsten layer or the molybdenum layer) 70 formed by the CVD using the gases described above; and if the fluorine diffuses into the insulating layer 72 or the columnar portion CL due to a heating process after the metal layer 70 formation, characteristic of the insulating layer 72 or the columnar portion CL may degrade.

According to the embodiment, the metal nitride film 91 prevents the fluorine diffusion from the metal layer 70 toward the insulating layer 72 and the fluorine diffusion from the metal layer 70 toward the columnar portion CL.

HF is produced when fluorine bonds with hydrogen (H) of moisture, HF may etch the silicon oxide layer. Therefore, the second portion 91b of the metal nitride film 91 provided between the metal layer 70 and the insulating layer 72 has a film thickness sufficient to prevent the diffusion of the fluorine.

On the other hand, the metal oxide film 35 which is the zirconium oxide film or the hafnium oxide film has a higher resistance to HF than does the insulating layer 72 which is he silicon oxide layer.

Therefore, the film thickness of the first portion 91a provided between the metal oxide film 35 and the metal layer 70 may be thinner than the film thickness of the second portion 91b provided between the insulating layer 72 and the metal layer 70.

The thinner film of the first portion 91a of the metal nitride film 91 formed on the side surface of the columnar portion CL ensures a gap sufficient for the metal layer 70 formation between the mutually-adjacent columnar portions CL when viewed in plan in FIG. 2. In other words, with the high density arrangement of the multiple columnar portions CL, a path for supplying the gas in the CVD of the metal layer 70 between the columnar portions CL distal to the slit ST can be ensured even if the spacing between the mutually-adjacent columnar portions CL becomes narrow. The metal layer 70 can be formed in the gap between the columnar portions CL distal to the slit ST before the metal layer 70 plugs the gap between the columnar portions CL proximal to the slit ST.

According to the embodiment, the metal nitride film 91 having a film thickness difference can be formed not by a multiply-divided process but by one CVD process.

Figure 18A:
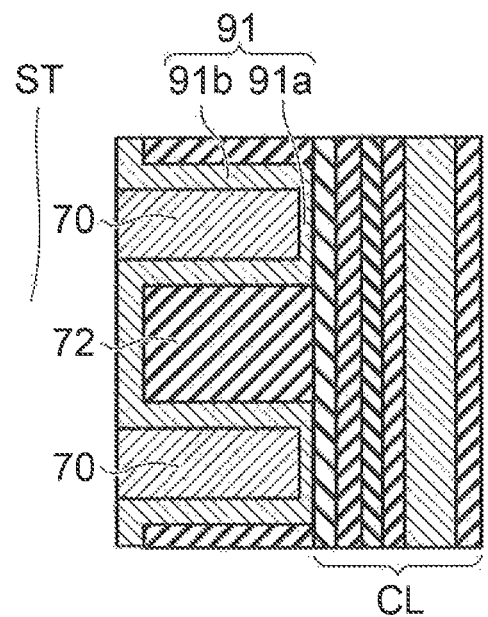

As shown in FIG. 17B, the metal layer 70 is formed also at the side surface of the slit ST. As shown in FIG. 18A, the metal layer 70 formed at the side surface of the slit ST is removed by an etchant or an etching gas supplied to the slit ST. For example, the metal layer 70 which is the tungsten layer is removed using a gas ($F_2$ gas or $NF_3$ gas) including fluorine. The electrical connection between the metal layers 70 adjacent to each other above and below is broken by the removal of the metal layer 70.

Figure 14:
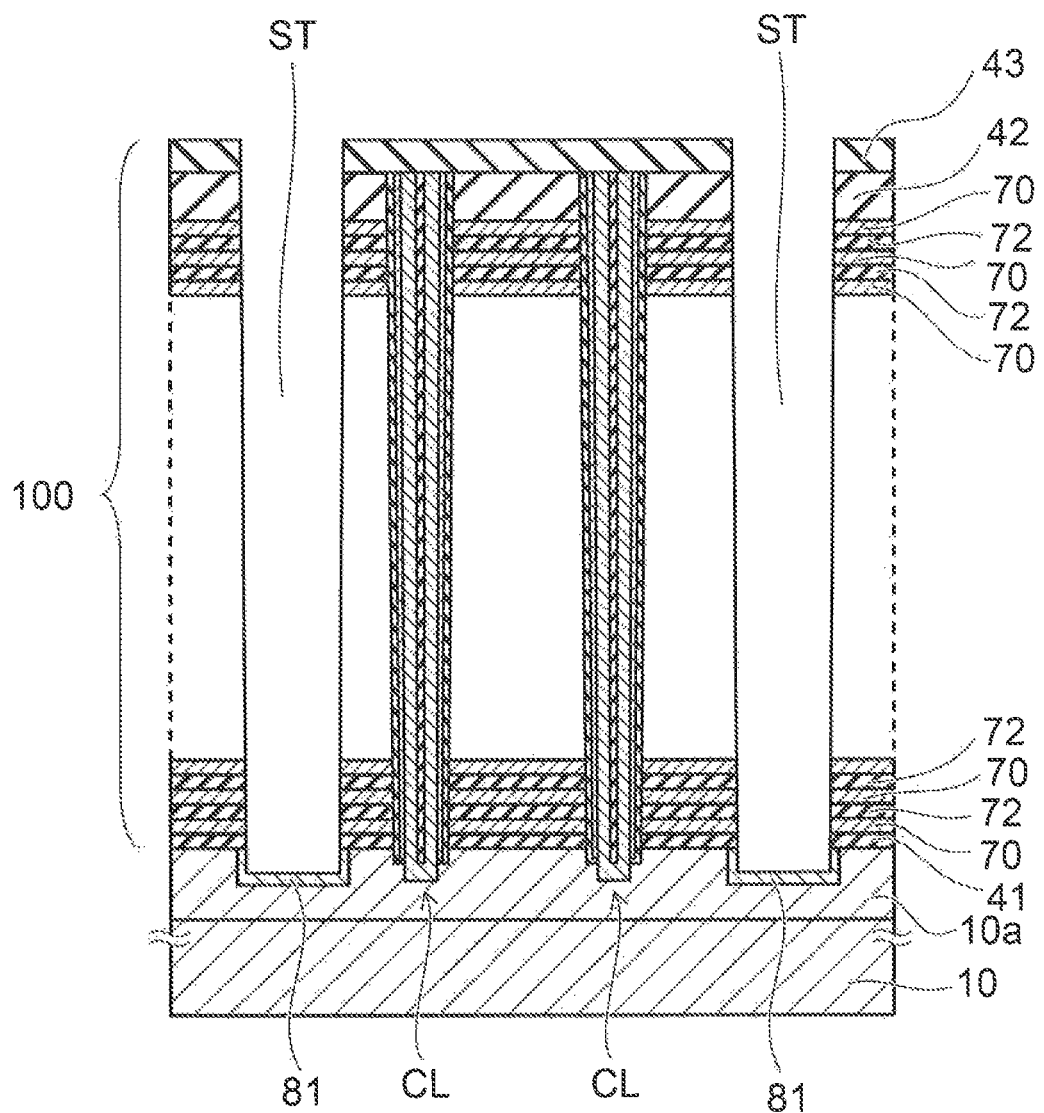
Figure 18B:
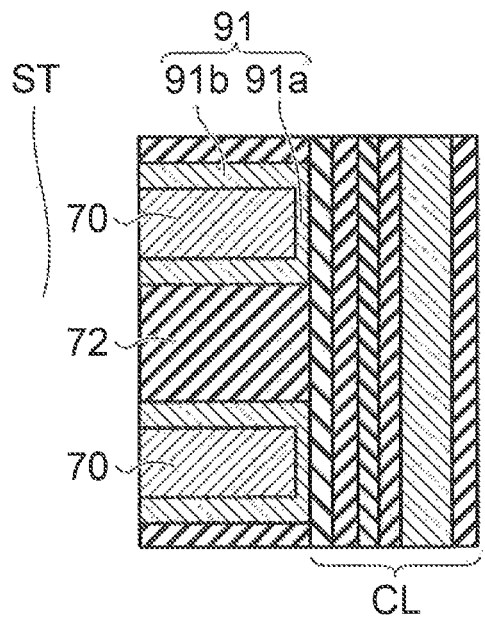

The metal layer 70 at the slit ST side surface is removed; and the metal nitride film 91 formed on the side surface of the insulating layer 72 is exposed in the slit ST. As shown in FIG. 18B and FIG. 14, the metal nitride film 91 that is on the side surface of the insulating layer 72 is removed by an etchant or an etching gas supplied to the slit ST. For example, the metal nitride film (the titanium nitride film) 91 that is on the side surface of the insulating layer 72 is removed using an etchant including phosphoric acid or an etching gas including chlorine ($Cl_2$).

The electrical connection via the metal nitride film 91 between the metal layers 70 adjacent to each other above and below is broken by the removal of the metal nitride film 91 on the insulating layer 72 side surface.

Figure 15:
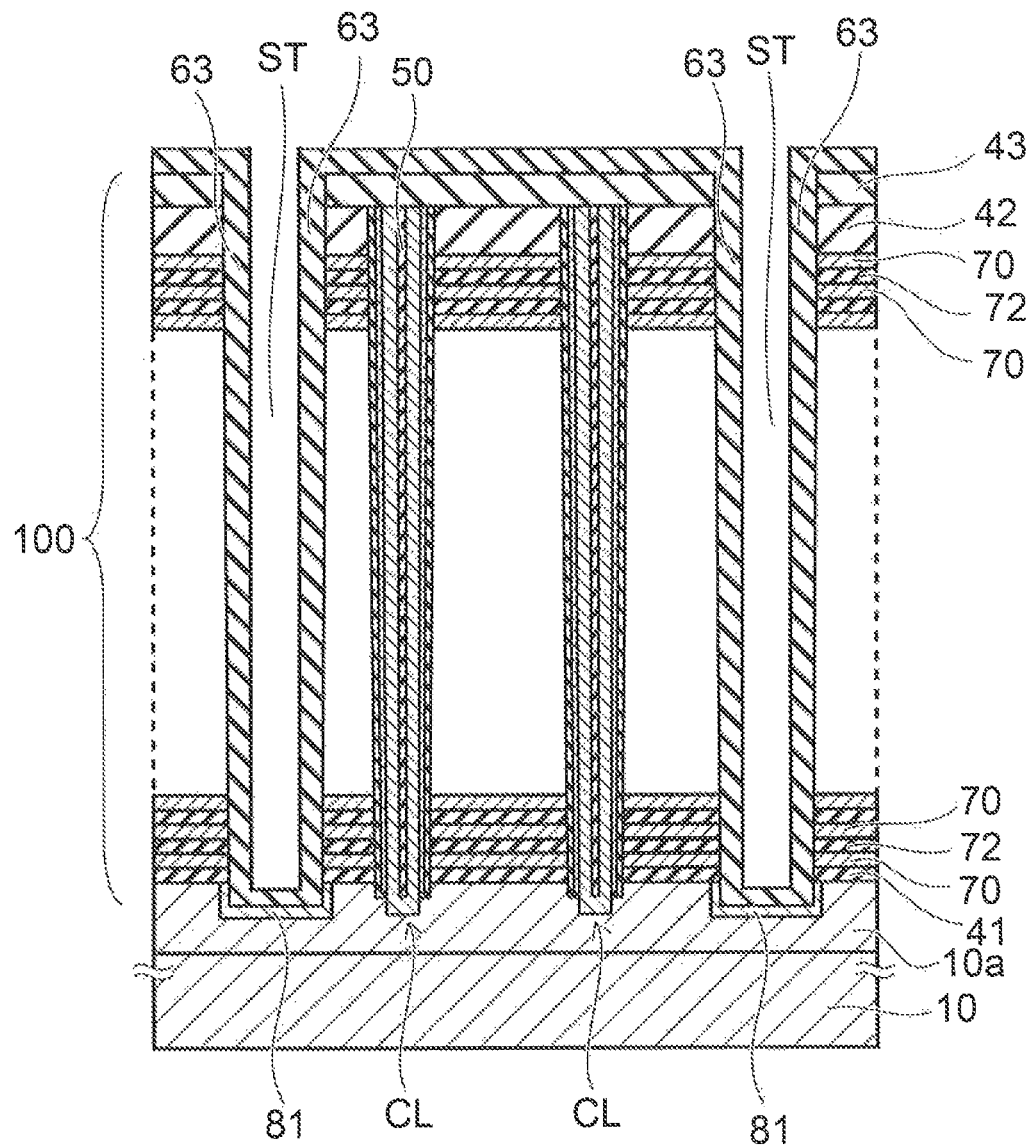

As shown in FIG. 15, the insulating film 63 is formed on the side surface and bottom of the slit ST. After removing the insulating film 63 formed on the bottom of the slit ST by RIE, the interconnect portion LI is filled onto the inner side of the insulating film 63 inside the slit ST as shown in FIG. 3. The lower end portion of the interconnect portion LI contacts the P-type well 10a of the substrate 10 via the semiconductor region 81.

Another example of the metal nitride film will now be described with reference to FIG. 4B.

Figure 4B:
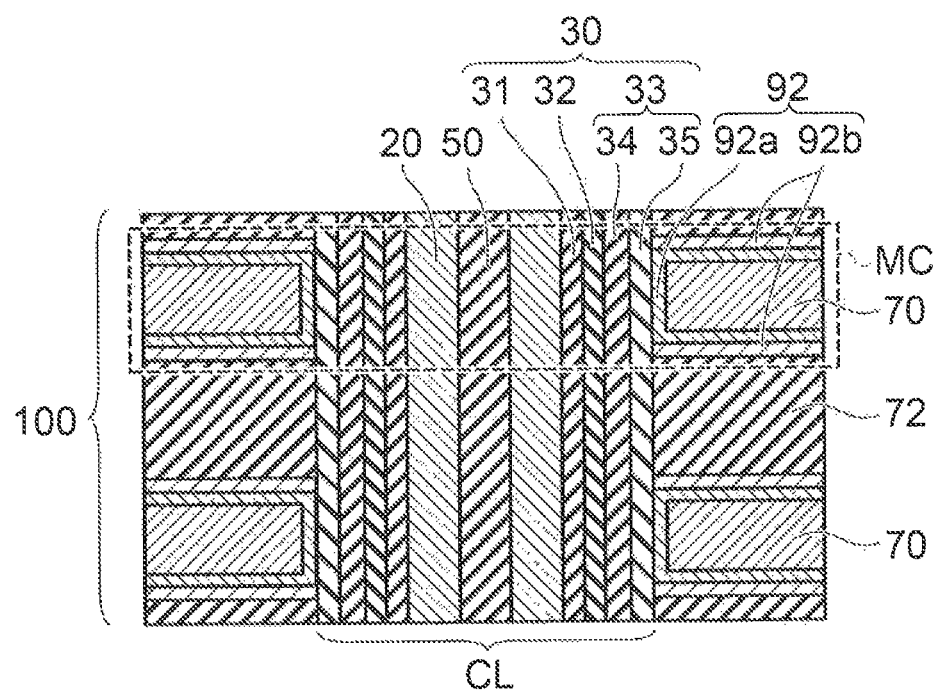

FIG. 4B is a cross-sectional view corresponding to the cross section of FIG. 4A.

A metal nitride film 92 is provided between the metal layer 70 and the memory film 30, and between the metal layer 70 and the insulating layer 72. The metal nitride film 92 is formed to be continuous along the upper surface of the metal layer 70, the lower surface of the metal layer 70, and the side surface of the metal layer 70 on the columnar portion CL side, The metal nitride film 92 is divided in the stacking direction of the stacked body 100, and is not continued in the stacking direction. The metal layers 70 are not shorted via the metal nitride film 92. The metal layers 70 surround, with the metal nitride film 92 interposed, the columnar portion CL from the outer circumferential side.

The metal nitride film 92 prevents, for example, the diffusion of the fluorine included in the metal layer 70. Also, the metal nitride film 92 functions as a seed layer when forming the metal layer 70 by CVD.

The metal nitride film 92 includes at least one of titanium nitride, titanium silicide nitride, tantalum nitride, tantalum silicide nitride, tungsten nitride, tungsten silicide nitride, molybdenum nitride, or molybdenum silicide nitride.

The metal nitride film 92 includes a first film 92a and a second film 92b. The first film 92a and the second film 92b may be the same material or may be different materials.

The first film 92a is provided on the upper surface of the metal layer 70, the lower surface of the metal layer 70, and the side surface of the metal layer 70 on the columnar portion CL side, and contacts the metal layer 70. The first film 92a is conformally provided to be continuous with a substantially uniform film thickness along the upper surface of the metal layer 70, the lower surface of the metal layer 70, and the side surface of the metal layer 70 on the columnar portion CL side. The portion of the first film 92a provided on the side surface of the metal layer 70 contacts the metal oxide film 35.

The second film 92b is provided between the insulating layer 72 and the first film 92a. The second film 92b contacts the insulating layer 72 and the first film 92a.

The first portion of the metal nitride film 92 provided between the metal oxide film 35 and the side surface of the metal layer 70 includes the first film 92a and does not include the second film 92b.

The second portion of the metal nitride film 92 provided between the insulating layer 72 and the upper surface of the metal layer 70, and the second portion provided between the insulating layer 72 and the lower surface of the metal layer 70 include the stacked film of the first film 92a and the second film 92b.

Accordingly, the film thickness of the first portion (the single-layer film of the first film 92a) of the metal nitride film 92 is thinner than the film thickness of the second portion (the stacked film of the first film 92a and the second film 92b). The film thickness of the metal layer 70 is thicker than two times the film thickness of the second portion of the metal nitride film 92.

Or, in addition to the first film 92a, the first portion of the metal nitride film 92 may include a second film 92b that is thinner than the second film 92b of the second portion. In such a case as well, the first portion of the metal nitride film 92 is thinner than the second portion of the metal nitride film 92.

A method for forming the metal nitride film 92 will now be described with reference to FIG. 19A to FIG. 21.

Figure 19A:
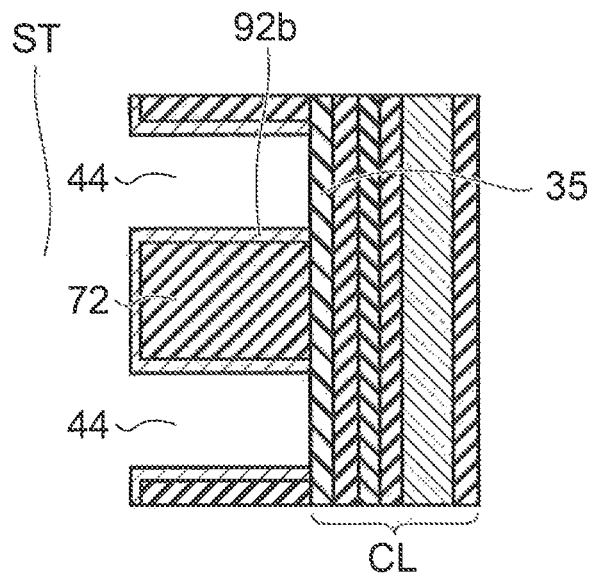

After forming the gaps 44 by removing the sacrificial layers 71, the second film 92b is formed inside the gaps 44 as shown in FIG. 19A.

As the second film 92b, for example, a titanium nitride film is formed by CVD using titanium chloride ($TiCl_4$) gas as a source gas of titanium and ($NH_3$) gas as a reducing gas, In the CVD as well, as described above, titanium nitride has different incubation times due to different foundations. The time when the growth of titanium nitride starts on the metal oxide film 35 which is the zirconium oxide film or the hafnium oxide film is slower than the time when the growth of titanium nitride starts on the insulating layer 72 which is the silicon oxide layer.

According to the example shown in FIG. 19A, the CVD of the second film (the titanium nitride film) 92b is stopped before the titanium nitride film starts to form on the metal oxide film 35. Accordingly, the second film 92b is formed on the upper surface of the insulating layer 72, the lower surface of the insulating layer 72, and the side surface of the insulating layer 72 on the slit ST side but is not formed on the side surface of the metal oxide film 35.

Figure 19B:
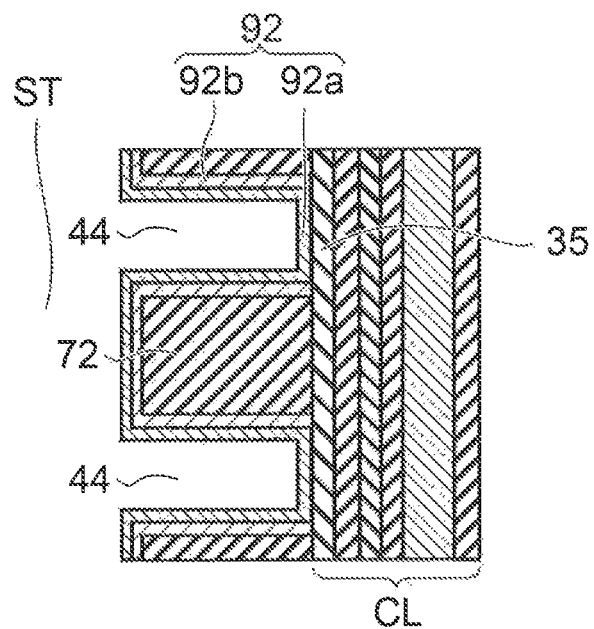

Then, as shown in FIG. 19B, the first film 92a is formed inside the gaps 44 on the inner side of the second film 92b.

As the first film 92a, for example, a titanium nitride film is formed by CVD using titanium chloride ($TiCl_4$) gas as a source gas of titanium and ($NH_3$) gas as a reducing gas.

The first film 92a is formed conformally along the second film 92b and the side surface of the metal oxide film 35. The first film 92a contacts the side surface of the metal oxide film 35.

There is substantially no difference between the incubation time of titanium nitride on the metal oxide film 35 and the incubation time of titanium nitride on titanium nitride; and the first film 92a is formed with a substantially uniform film thickness along the second film 92b and the side surface of the metal oxide film 35.

A stacked film of the second film 92b and the first film 92a is formed on the upper surface of the insulating layer 72, the lower surface of the insulating layer 72, and the side surface of the insulating layer 72 on the slit ST side. A single-layer film of the first film 92a is formed on the side surface of the metal oxide film 35.

Accordingly, the film thickness of the portion (the first portion) of the metal nitride film 92 formed on the side surface of the metal oxide film 35 is thinner than the film thickness of the portion (the second portion) of the metal nitride film 92 formed on the upper surface and lower surface of the insulating layer 72.

Figure 20A:
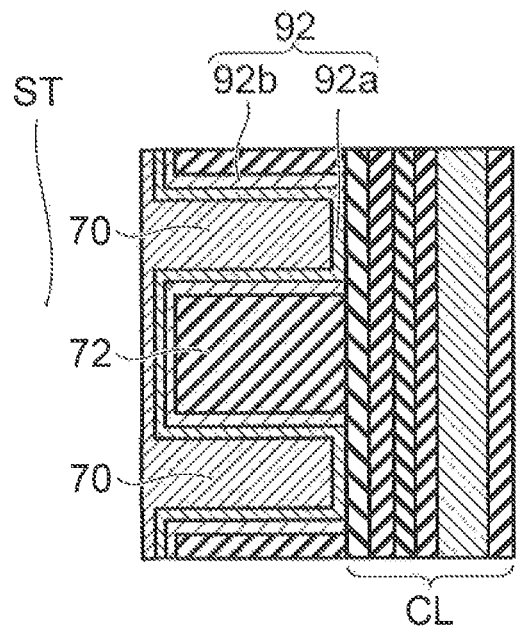

Chlorine is incorporated into the first film 92a and the second film 92b that are both formed by CVD using a gas including titanium chloride. By controlling the CVD conditions at this time, the chlorine concentration of the second film 92b is set to be higher than the chlorine concentration of the first film 92a. For example, the chlorine concentration can be set to be high by reducing the temperature in the CVD, The gaps 44 remain on the inner side of the metal nitride film 92. As shown in FIG. 20A, the metal layer 70 is formed in the gaps 44. Similarly to the embodiment recited above, a tungsten layer or a molybdenum layer is formed as the metal layer 70 by CVD using the metal nitride film 92 as a seed, In the CVD, tungsten fluoride or molybdenum fluoride is used as the source gas. Therefore, the metal layer 70 includes fluorine.

The second portion of the metal nitride film 92 provided between the metal layer 70 and the insulating layer 72 (the stacked film of the first film 92a and the second film 92b) has a film thickness sufficient to prevent the diffusion of the fluorine.

On the other hand, the metal oxide film 35 which is the zirconium oxide film or the hafnium oxide film has a higher resistance to HF than does the insulating layer 72 which is the silicon oxide layer. Therefore, the film thickness of the first portion of the metal nitride film 92 (the single-layer film of the first film 92a) provided between the metal oxide film 35 and the metal layer 70 may be thinner than the film thickness of the second portion provided between the insulating layer 72 and the metal layer 70.

As described above, the thinner film of the first portion of the metal nitride film 92 formed on the side surface of the columnar portion CL ensures the path for supplying the gas in the CVD of the metal layer 70 between the columnar portions CL distal to the slit ST. The metal layer 70 can be formed in the gap between the columnar portions CL distal to the slit ST before the metal layer 70 plugs the gap between the columnar portions CL proximal to the slit ST.

Figure 20B:
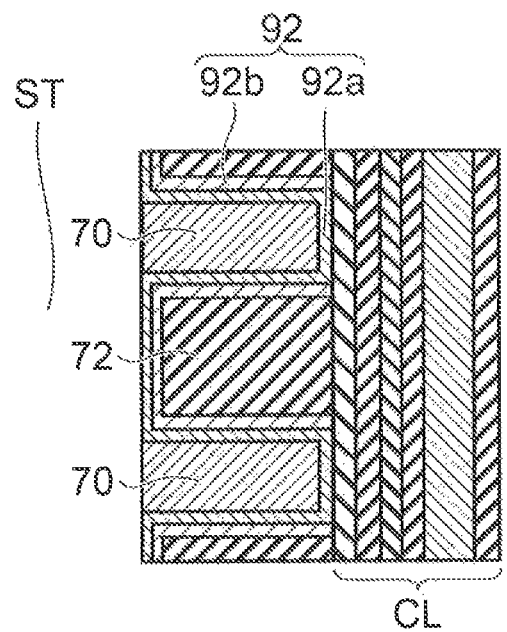

As shown in FIG. 20A, the metal layer 70 is formed also at the side surface of the slit ST. The metal layer 70 formed at the side surface of the slit ST is removed as shown in FIG. 20B by an etchant or an etching gas supplied to the slit ST. For example, the metal layer 70 which is the tungsten layer is removed using a gas ($F_2$ gas or $NF_3$ gas) including fluorine. The electrical connection between the metal layers 70 adjacent to each other above and below is broken by the removal of the metal layer 70.

Figure 21:
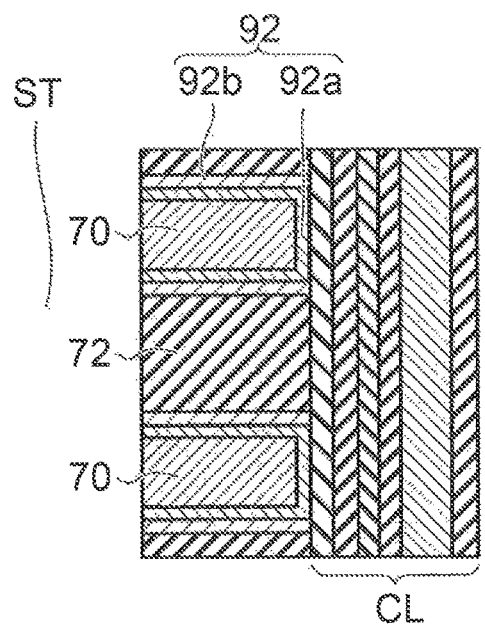

The metal layer 70 at the slit ST side surface is removed; and the metal nitride film 92 formed on the side surfaces of the insulating layers 72 is exposed in the slit ST. The metal nitride film 92 on the side surfaces of the insulating layers 72 is removed as shown in FIG. 21 by an etchant or an etching gas supplied to the slit ST. The electrical connection via the metal nitride film 92 between the metal layers 70 adjacent to each other above and below is broken by the removal of the metal nitride film 92 on the insulating layer 72 side surfaces.

For example, the metal nitride film (the titanium nitride film) 92 on the insulating layer 72 side surfaces is removed using an etchant including phosphoric acid or a gas including chlorine ($Cl_2$).

As the chlorine concentration of the titanium nitride film becomes high, the etching selectivity of the titanium nitride with respect to the tungsten or the molybdenum can be set to be high when etching the titanium nitride film using an etchant including phosphoric acid or a gas including chlorine ($Cl_2$).

The metal nitride film 92 formed on the side surface of the insulating layer 72 on the slit ST side shown in FIG. 20B includes the second film 92b having a higher chlorine concentration than that of the first film 92a. Therefore, when etching the metal nitride film 92 on the side surfaces of the insulating layers 72, the selective etching of the metal nitride film 92 can be easier and the etching consumption amount of the metal layer 70 from the slit ST side can be suppressed better than for a configuration in which the metal nitride film 92 is only the first film 92a. This suppresses the increased resistance due to the volume reduction of the metal layer 70.

On the other hand, at the portion contacting the metal oxide film 35, only the first film 92a having the lower chlorine concentration than that of the second film 92b is formed; and the second film 92b is not formed. This suppresses the effects of the chlorine on the function of each film of the columnar portion CL.

In the process shown in FIG. 19A, the second film 92b may be formed also on the side surface of the metal oxide film 35. In such a case, by utilizing the difference of the incubation time of titanium nitride, the CVD is stopped when the film thickness of the second film 92b formed on the side surface of the metal oxide film 35 is thinner than the film thickness of the second film 92b formed on the upper surface and lower surface of the insulating layer 72.

Subsequently, the first film 92a is formed conformally with a substantially uniform film thickness along the second film 92b and the metal oxide film 35.

Being dependent on the film thickness difference of the second film 92b, the film thickness of the first portion of the metal nitride film 92 provided on the side surface of the metal oxide film 35 is thinner than the film thickness of the second portion provided on the upper surface and lower surface of the insulating layer 72.

Considering the effects of the chlorine on the columnar portion CL, it is desirable to have no second film 92b in the first portion. Or, it is desirable for the second film 92b of the first portion to be as thin as possible.

Although titanium nitride films are illustrated in the embodiment recited above as examples of the metal nitride films 91 and 92, effects similar to those of the titanium nitride film can be expected for a titanium silicide nitride film, a tantalum nitride film, a tantalum silicide nitride film, a tungsten nitride film, a tungsten silicide nitride film, a molybdenum nitride film, and a molybdenum silicide nitride film as well.

After the processes shown in FIG. 14 and FIG. 18B, the insulating layers 72 may be removed by etching through the slit ST. For example, the insulating layers 72 which are the silicon oxide layers can be removed using an etchant including hydrofluoric acid.

Figure 23:
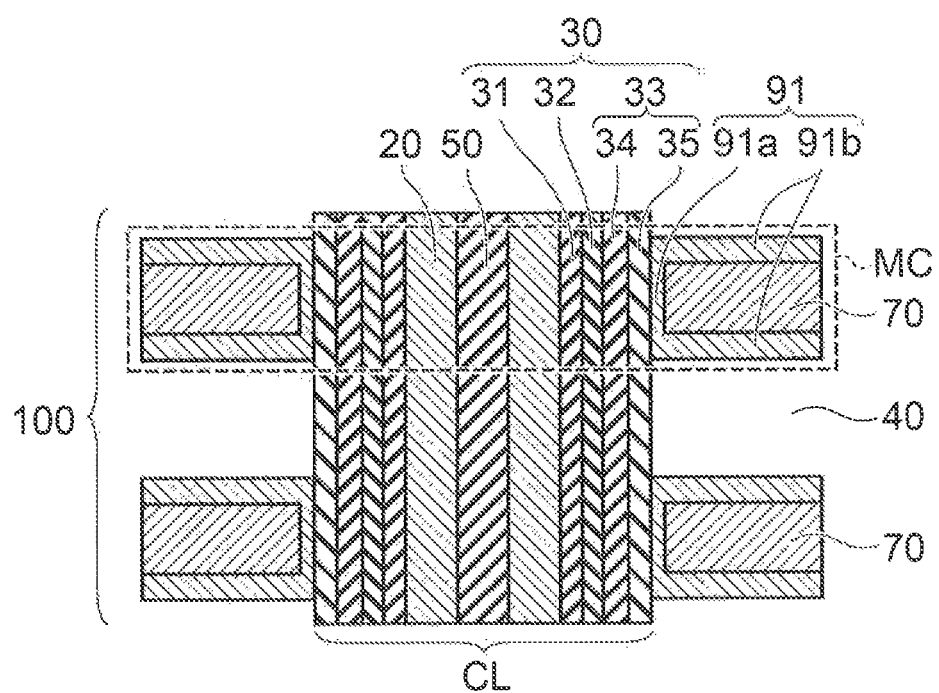
FIG. 23 is a schematic cross-sectional view of a semiconductor device of the embodiment.

The insulating layers 72 are removed; and as shown in FIG. 23, gaps 40 are formed as an insulator between the metal layers 70 adjacent to each other above and below. The metal layers 70 contact the side surfaces of the columnar portions CL to surround the side surfaces of the columnar portions CL. The metal layers 70 are supported by such a physical bond with the columnar portions CL; and the gaps 40 are maintained between the metal layers 70.

The gaps 40 are formed between the metal layers 70 which are the control gates of the memory cells MC adjacent to each other in the stacking direction. The gap 40 having a Rawer dielectric constant than that of an insulating film such as a silicon oxide film, etc., reduces the interconnect capacitance between the metal layers 70 above and below, and makes high-speed operations of the memory cells MC possible. Further, interference between adjacent cells such as the threshold fluctuation due to capacitive coupling between the metal layers 70 above and below, etc., can be suppressed.

Gaps may be used in the structure shown in FIG. 4B as well by removing the insulating layers 72.

Figure 24:
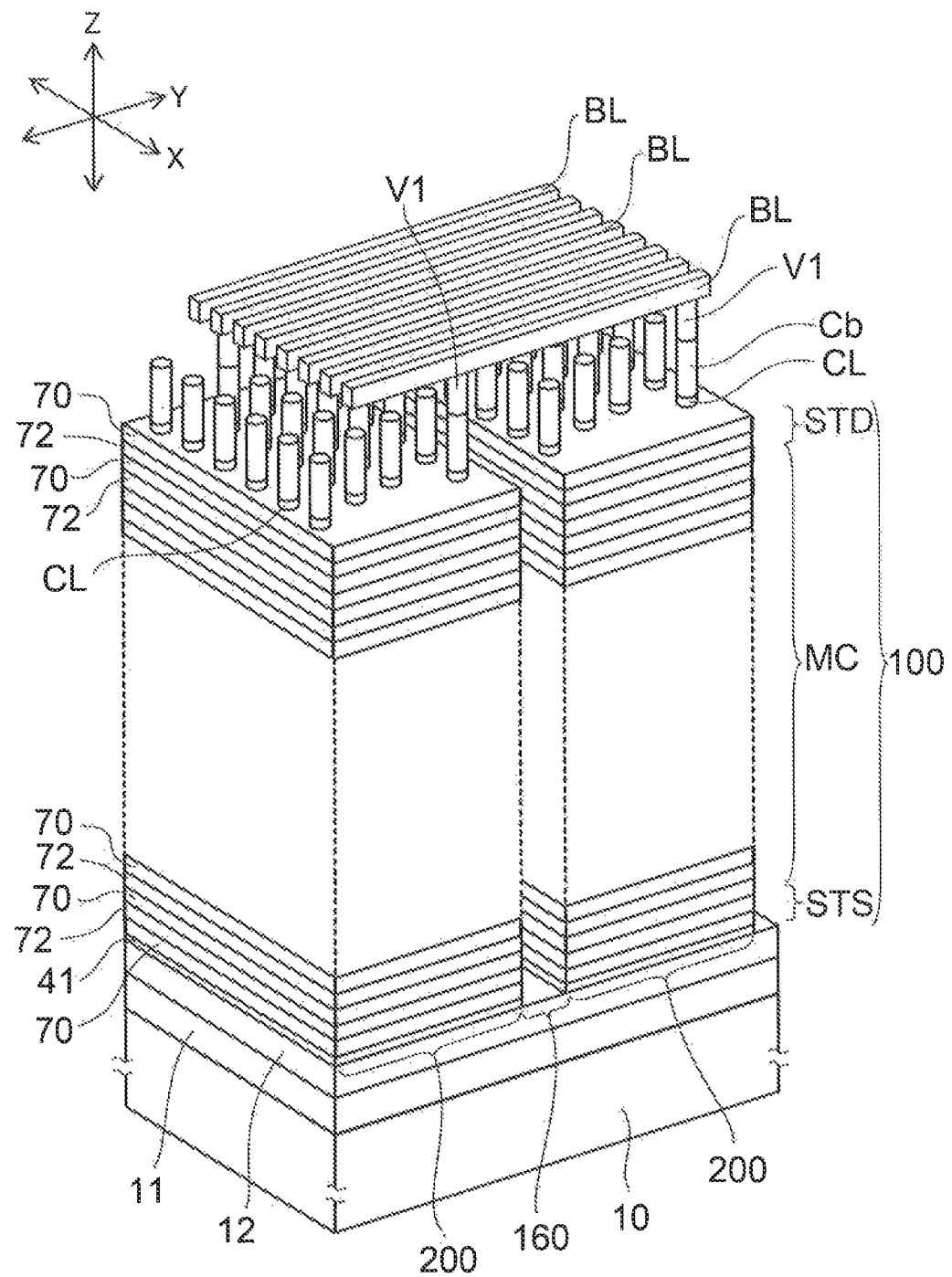
FIG. 24 is a schematic perspective view of a semiconductor device of the embodiment.

FIG. 24 is a schematic perspective view of another example of the memory cell array of the embodiment.

A first foundation layer 11 and a second foundation layer 12 are provided between the substrate 10 and the stacked body 100. The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer.

The first foundation layer 11 includes transistors and interconnects forming a control circuit.

The lower ends of the semiconductor bodies 20 of the columnar portions CL contact the second foundation layer 12; and the second foundation layer 12 is connected to the control circuit. Accordingly, the lower ends of the semiconductor bodies 20 of the columnar portions CL are electrically connected to the control circuit via the second foundation layer 12. The second foundation layer 12 can be used as a source layer.

The stacked body 100 is divided into the multiple blocks (or the finger portions) 200 in the Y-direction by a separation portion 160. The separation portion 160 is an insulating film and does not include an interconnect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a foundation layer;
   a stacked body provided above the foundation layer, the stacked body including a plurality of metal layers stacked with an insulator interposed, the metal layers functioning as control gates of memory cells;
   a semiconductor body extending in a stacking direction through the stacked body;
   a charge storage portion provided between the semiconductor body and one of the metal layers; and
   a metal nitride film having a first portion and a second portion, the first portion being provided between the charge storage portion and one of the metal layers, the second portion being thicker than the first portion and being provided between one of the metal layers and the insulator.

2. The semiconductor device according to claim 1, further comprising a metal oxide film provided between the charge storage portion and one of the metal layers, the metal oxide film including at least one of zirconium or hafnium.

3. The semiconductor device according to claim 2, wherein the metal nitride film includes at least one of titanium nitride, titanium silicide nitride, tantalum nitride, tantalum silicide nitride, tungsten nitride, tungsten silicide nitride, molybdenum nitride, or molybdenum silicide nitride.

4. The semiconductor device according to claim 2, wherein the insulator is a silicon oxide layer.

5. The semiconductor device according to claim 2, wherein the metal layers include at least one of tungsten or molybdenum.

6. The semiconductor device according to claim 5, wherein the metal layers include fluorine.

7. The semiconductor device according to claim 5, wherein the metal nitride film is a titanium nitride film.

8. The semiconductor device according to claim 7, wherein the titanium nitride film includes chlorine.

9. The semiconductor device according to claim 8, wherein
   the titanium nitride film includes a first film and a second film, a chlorine concentration of the second film being higher than a chlorine concentration of the first film,
   the first film is provided to be continuous on an upper surface of one of the metal layers, a lower surface of one of the metal layers, and a side surface of one of the metal layers on the metal oxide film side, and
   the second film is provided between the first film and the insulator.

10. The semiconductor device according to claim 9, wherein the first portion does not include the second film.

11. The semiconductor device according to claim 2, further comprising a first silicon oxide film provided between the metal oxide film and the charge storage portion.

12. The semiconductor device according to claim 2, further comprising a second silicon oxide film provided between the charge storage portion and the semiconductor body.

13. The semiconductor device according to claim 2, wherein the metal oxide film extends to be continuous along the stacking direction.

* * * * *